United States Patent
Lin et al.

(10) Patent No.: US 9,626,890 B2
(45) Date of Patent: Apr. 18, 2017

(54) SHIFT REGISTER AND METHOD OF DRIVING SHIFT REGISTER

(71) Applicant: AU Optronics Corp., Hsin-Chu (TW)

(72) Inventors: Wei-Li Lin, Hsin-Chu (TW); Che-Wei Tung, Hsin-Chu (TW); Chia-Heng Chen, Hsin-Chu (TW)

(73) Assignee: AU OPTRONICS CORP., Hsin-Chu (TW)

( * ) Notice: Subject to any disclaimer, the term of this patent is extended or adjusted under 35 U.S.C. 154(b) by 91 days.

(21) Appl. No.: 14/803,126

(22) Filed: Jul. 20, 2015

(65) Prior Publication Data

US 2016/0019828 A1    Jan. 21, 2016

(30) Foreign Application Priority Data

Jul. 18, 2014   (TW) .............................. 103124818 A

(51) Int. Cl.
*G11C 19/00* (2006.01)
*G09G 3/20* (2006.01)
*G11C 19/28* (2006.01)

(52) U.S. Cl.
CPC ........ *G09G 3/20* (2013.01); *G09G 2310/0267* (2013.01); *G09G 2310/0286* (2013.01); *G09G 2310/08* (2013.01); *G09G 2320/0214* (2013.01); *G09G 2320/0219* (2013.01); *G11C 19/28* (2013.01)

(58) Field of Classification Search
None
See application file for complete search history.

(56) References Cited

U.S. PATENT DOCUMENTS

| 7,817,771 | B2 | 10/2010 | Tsai | |
|---|---|---|---|---|
| 8,396,183 | B2* | 3/2013 | Yang | G09G 3/20 377/64 |
| 8,811,567 | B2* | 8/2014 | Wu | G11C 19/28 377/64 |
| 8,816,949 | B2* | 8/2014 | Tobita | G09G 3/3677 345/92 |
| 9,042,509 | B2* | 5/2015 | Yu | G02F 1/13306 377/64 |
| 9,171,641 | B2* | 10/2015 | Chien | G11C 19/28 |

(Continued)

FOREIGN PATENT DOCUMENTS

| CN | 103489484 A | 1/2014 |
|---|---|---|
| CN | 103606359 A | 2/2014 |

*Primary Examiner* — Tuan T Lam
(74) *Attorney, Agent, or Firm* — Locke Lord LLP; Tim Tingkang Xia, Esq.

(57) ABSTRACT

A shift register includes a plurality of stages of shift register circuit. Each stage of shift register circuit includes a first switch, an input circuit, a pull-down circuit, and a pull-down voltage regulator circuit. The first switch is used to output a scan signal according to a voltage level of a node and a clock signal. The input circuit is used to pull up the voltage level of the node according to a signal from a previous M-th stage of shift register circuit. The pull-down circuit is used to pull down the voltage level of the node according to the clock signal and a signal from a following L-th shift register circuit and reduce current leakage at the node. The pull-down voltage regulator circuit is used to pull down the voltage levels of the node and the scan signal according to the voltage level of the node.

11 Claims, 16 Drawing Sheets

(56) References Cited

U.S. PATENT DOCUMENTS

| | | | |
|---|---|---|---|
| 2006/0187177 A1 | 8/2006 | Kuo | |
| 2009/0304138 A1* | 12/2009 | Tsai | G11C 19/28 377/79 |
| 2011/0150169 A1* | 6/2011 | Lin | G11C 19/28 377/64 |
| 2012/0051494 A1* | 3/2012 | Yang | G11C 19/28 377/67 |
| 2012/0169581 A1* | 7/2012 | Su | G11C 19/28 345/100 |
| 2015/0255031 A1 | 9/2015 | Cao | |
| 2015/0310819 A1* | 10/2015 | Xiao | G11C 19/28 345/212 |

* cited by examiner

US 9,626,890 B2

SHIFT REGISTER AND METHOD OF DRIVING SHIFT REGISTER

BACKGROUND OF THE INVENTION

1. Field of the Invention

The present invention relates to a shift register, and more particularly, to a circuit structure of a shift register.

2. Description of the Prior Art

Generally, a display panel includes a plurality of pixels, a gate driver, and a source driver. The gate driver includes a plurality of stages of shift registers and is used to provide a plurality of gate driving signals for turning on and off the pixels. The source driver is used to write the data into the turned-on pixels.

FIG. 1 shows the shift register circuit 100 according to prior art. The shift register circuit 100 includes switches T1A, T1B, T1E, T1G, T1H, T1K, T1L, T1M and T1N. The switch T1A has a first terminal for receiving a clock signal CK, a second terminal as an output terminal $O_N$ of the shift register circuit 100 for outputting a scan signal $G_N$ of the shift register 100, and a control terminal electrically coupled to a node $Q_N$ of the shift register circuit 100. The switch T1B has a first terminal for receiving a scan signal $G_{N-1}$ outputted from an N−1 stage of shift register circuit, a second terminal electrically coupled to the node $Q_N$, and a control terminal electrically coupled to the first terminal of the switch T1B. The switch T1E has a first terminal electrically coupled to the node $Q_N$, the second terminal electrically coupled to a system voltage terminal $V_{ss}$, and a control terminal for receiving a scan signal $G_{N+2}$ outputted from an N+2 stage of shift register circuit. The switch T1G has a first terminal for receiving a high voltage level VGH, and a control terminal electrically coupled to the first terminal of the switch T1G. The switch T1H has a first terminal electrically coupled to the first terminal of the switch T1G, and a control terminal electrically coupled to a second terminal of the switch T1G. The switch T1K has a first terminal electrically coupled to a second terminal of the switch T1G, a second terminal electrically coupled to the system voltage terminal $V_{ss}$, and a control terminal electrically coupled to the node $Q_N$. The switch T1L has a first terminal electrically coupled to the second terminal of the switch T1H, a second terminal electrically coupled to the system voltage terminal $V_{ss}$, and a control terminal electrically coupled to the node $Q_N$. The switch T1M has a first terminal electrically coupled to the node $Q_N$, a second terminal electrically coupled to the second terminal of the switch T1A, and a control terminal electrically coupled to the second terminal of the switch T1H. The switch T1N has a first terminal electrically coupled to the second terminal $O_N$ of the switch T1A, a second terminal electrically coupled to the system voltage terminal $V_{ss}$, and a control terminal electrically coupled to the second terminal of the switch T1H. The system voltage terminal $V_{ss}$ can used to provide a low voltage level VGL.

FIG. 2 is the timing diagram of the shift register 100. During the period T1, the scan signal $G_{N-1}$ is pulled up to the high voltage level VGH, the scan signal $G_{N+2}$ remains at the low voltage level VGL, and the clock signal CK is at the low voltage level VGL. At this time, the switch T1B is turned on so the voltage level of the node $Q_N$ is also pulled up to the high voltage level VGH, which turns on the switch T1A and controls the voltage level of the scan signal $G_N$ to remain at the same low gate voltage level VGL as the clock signal CK. The switches T1G, T1K and T1L are turned on. However, since the driving power of the switch T1K is stronger than the driving power of the switch T1G, the control terminal of the switch T1H is kept at the low voltage level VGL and is turned off and the voltage level of the second terminal of the switch T1H is also kept at the low voltage level VGL turning off the switches T1M and T1N. The switch T1E is also turned off.

During the period T2, the scan signal $G_{N-1}$ is changed back to the low voltage level VGL, the scan signal $G_{N+2}$ is kept at the low voltage level VGL, and the clock signal CK is changed to the high voltage level VGH. At this time, the switch T1B is turned off and the switch T1A is still turned on, which pulls up the voltage level of the scan signal $G_N$ to the high voltage level VGH as the clock signal CK. The voltage level of the node $Q_N$ is pulled up to a voltage level that is about two times the high voltage level VGH (that is, 2VGH) due to the coupling effect of the capacitor C1. The switches T1G, T1K, T1L are still turned on and the switches T1H, T1M, T1N and T1E are still turned off. In addition, during the period of T2, although the high voltage level of the node $Q_N$ can pull up the voltage level of the scan signal $G_N$ to the high voltage level VGH quickly, it also enlarges the source-drain voltage gap $V_{ds}$ of the switch T1B and the source-drain voltage gap $V_{ds}$ of the switch T1E, which are close to two times high voltage level 2VGH. Such high source-drain voltage gap $V_{ds}$ can usually cause big current leakage, pull down the voltage level of the $Q_N$ and weaken the driving power of the switch T1A to pull up the scan signal $G_N$.

During the period T3, the scan signals $G_{N-1}$ and $G_{N+2}$ are both kept at the low voltage level VGL, and the clock signal CK is changed to the low voltage level VGL. The switch T1B is still turned off and the switch T1A is kept turned on so the scan signal $G_N$ is pulled down to the same low voltage level VGL as the clock signal CK. The switches T1G, T1K and T1L are still turned on and the switches T1H, T1M, T1N and T1E are still turned off.

During the period of T4, the scan signal $G_{N-1}$ is kept at the low voltage level VGL, the scan signal $G_{N+}2$ is changed to the high voltage level VGH, and the clock signal CK is still at the low voltage level VGL. The switch T1B is still turned off and the switch T1E is turned on so the voltage level of the node $Q_N$ is pulled down to the low voltage level VGL. Thus, the switches T1A, T1K, and T1L are tuned off. The switch T1G is kept turned, which also turns on the switches T1H, T1M and T1N so the voltage levels of the node $Q_N$ and the scan signal $G_N$ are both kept at the low voltage level VGL stably.

As the resolution of the display panel becomes higher and higher, the time for the source driver to transmit a bit of pixel information is also shortened. However, since the driving power of the switch T1A to pull up the scan signal $G_N$ is weakened due to the current leakage on the switches T1B and T1E as the operations of the shift register circuit 100 in the period T2 shown in FIG. 2, the transition of the voltage level of the scan signal $G_N$ may not be fast enough and may cause wrong charging of the pixels of the display panel.

SUMMARY OF THE INVENTION

One embodiment of the present invention discloses a shift register. The shift register comprises a plurality of stages of shift register circuit, and each stage of shift register circuit comprises a first switch, an input circuit, a pull-down circuit, and a pull-down voltage regulator circuit. The first switch has a first terminal for receiving a clock signal, a second terminal for outputting a first scan signal of the current stage of shift register circuit, and a control terminal electrically coupled to a node of the current stage of shift register circuit.

The input circuit comprises a second switch and a receiving circuit. The second switch has a first terminal, a second terminal electrically coupled to the node of the current stage of shift register circuit, and a control terminal electrically coupled to a node of a previous M-th stage of shift register circuit in the plurality of stages of shift register circuit, wherein M is a positive integer. The receiving circuit is electrically coupled to the first terminal of the second switch and for receiving a scan signal outputted from the previous M-th stage of shift register circuit and control a voltage level of the first terminal of the second switch according to the scan signal. The pull-down circuit is electrically coupled to the node of the current stage of shift register circuit and for pulling down a voltage level of the node of the current stage of shift register circuit according to a scan signal outputted from a following L-th stage of shift register circuit in the plurality of stages of shift register circuit, wherein N is a positive integer. The pull-down voltage regulator circuit is electrically coupled to the node of the current stage of shift register circuit and the second terminal of the first switch and for pulling down the voltage level of the node of the current stage of shift register circuit and a voltage level of the second terminal of the first switch according to the voltage level of the node of the current stage of shift register circuit.

Another embodiment of the present invention discloses a shift register. The shift register comprises a plurality of stages of shift register circuit and each stage of shift register circuit comprises an input circuit, a first switch, a pull-down circuit and a pull-down voltage regulator circuit. The input circuit is for receiving a scan signal outputted from a previous M-th stage of shift register circuit and to pull up a voltage level of a node of the current stage of shift register circuit according to the scan signal, wherein M is a positive integer. The first switch has a first terminal for receiving a clock signal, a second terminal for outputting a first scan signal of the current stage of shift register circuit, and a control terminal electrically coupled to the node of the current stage of shift register circuit. The pull-down circuit comprises a second switch and a pull-down controlling circuit. The second switch has a first end electrically coupled to the node of the current stage of shift register circuit, a second terminal electrically coupled to the second terminal of the first switch, and a control terminal. The pull-down controlling circuit is for receiving the clock signal and a scan signal outputted from a following L-th stage of shift register circuit in the plurality of stages of shift register circuit, and for controlling a voltage level of the control terminal of the second switch according to the clock signal and the scan signal outputted from the following L-th stage of shift register circuit, wherein L is a positive integer. The first pull-down voltage regulator circuit is electrically coupled to the node of the current stage of shift register circuit, the second terminal of the first switch and a node of the following L-th stage of shift register circuit, and for pulling down a voltage level of the second terminal of the first switch according to the voltage level of the node of the current stage of shift register circuit and a voltage level of the node of the following L-th stage of shift register circuit.

Another embodiment of the present invention discloses a method of operating a shift register. The method comprises providing the shift register comprising a plurality of stages of shift register circuit, each stage of shift register circuit comprising an input circuit, a first switch, a capacitor, a pull-down circuit and a pull-down voltage regulator circuit, the first switch having a first terminal electrically coupled to the input circuit, a second terminal, and a control terminal, the capacitor having a first terminal electrically coupled to the control terminal of the first switch, a second terminal electrically coupled the second terminal of the first switch, the pull-down circuit comprising a pull-down controlling circuit and a second switch, the second switch having a first terminal electrically coupled to the control terminal of the first switch, a second terminal electrically coupled to the second terminal of the first switch, and a control terminal electrically coupled to the pull-down controlling circuit, the pull-down voltage regulator circuit electrically coupled to the second terminal and the control terminal of the first switch. The method comprises receiving, by the input circuit, a scan signal having a first high voltage level outputted from a previous M-th stage of shift register circuit to enable the input circuit to pull up a voltage level of the control terminal of the first switch, wherein M is a positive integer, receiving, by the first terminal of the first switch and the pull-down controlling circuit, a clock signal having the first high voltage level to enable the second terminal of the first switch to output a scan signal having the first high voltage level, enable the capacitor to couple the voltage level of the control terminal of the first switch to a second high voltage level, wherein the second high voltage level is higher than the first high voltage level, and enable the pull-down controlling circuit to pull up a voltage level of the control terminal of the second switch, and enabling the clock signal to have a low voltage level to enable the second terminal of the first switch to be pulled down to the low voltage level and enable the capacitor to pull down the voltage level of the control terminal of the first switch.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
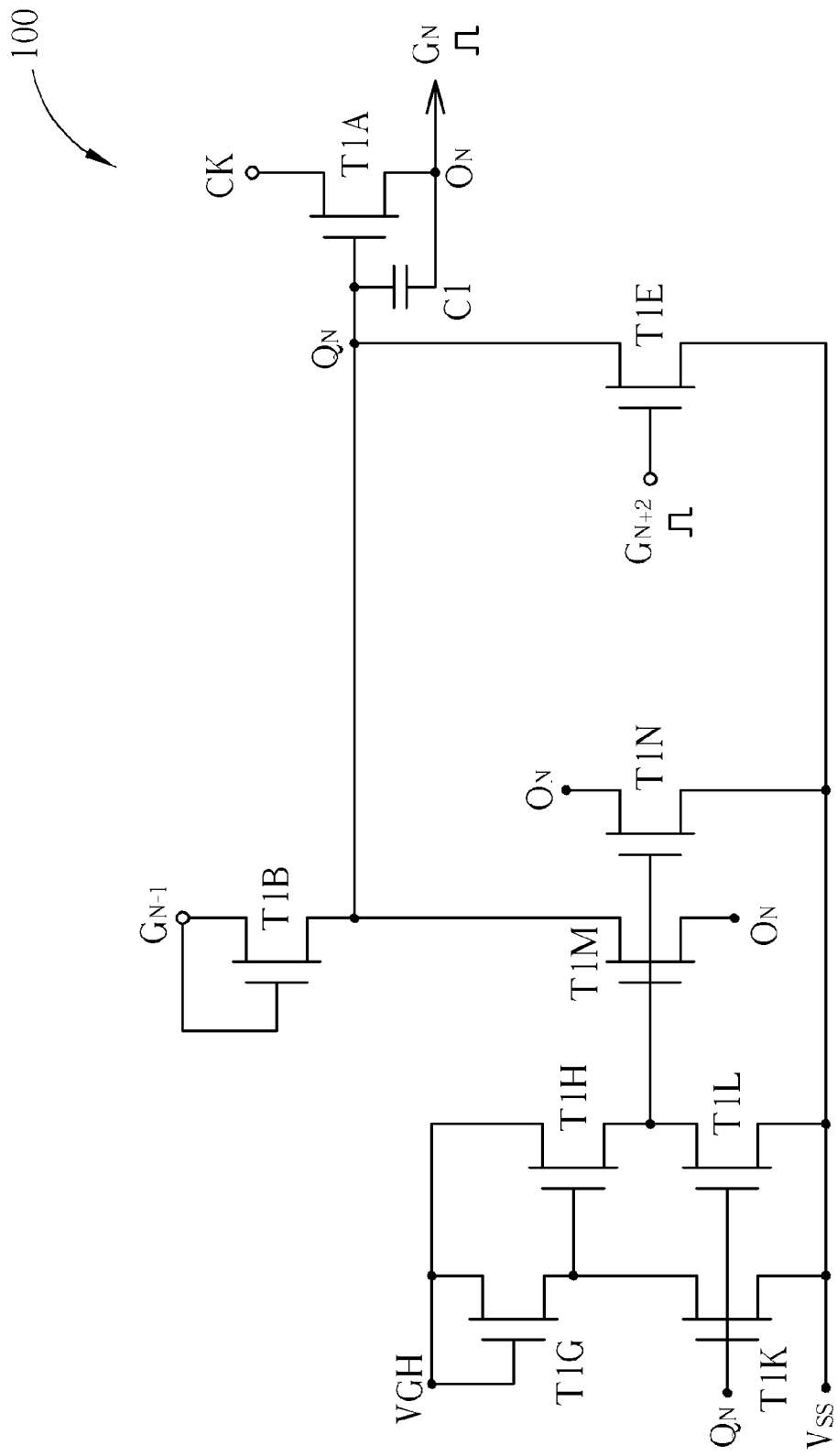
FIG. 1 shows a shift register circuit according to the prior art.
Figure 2:
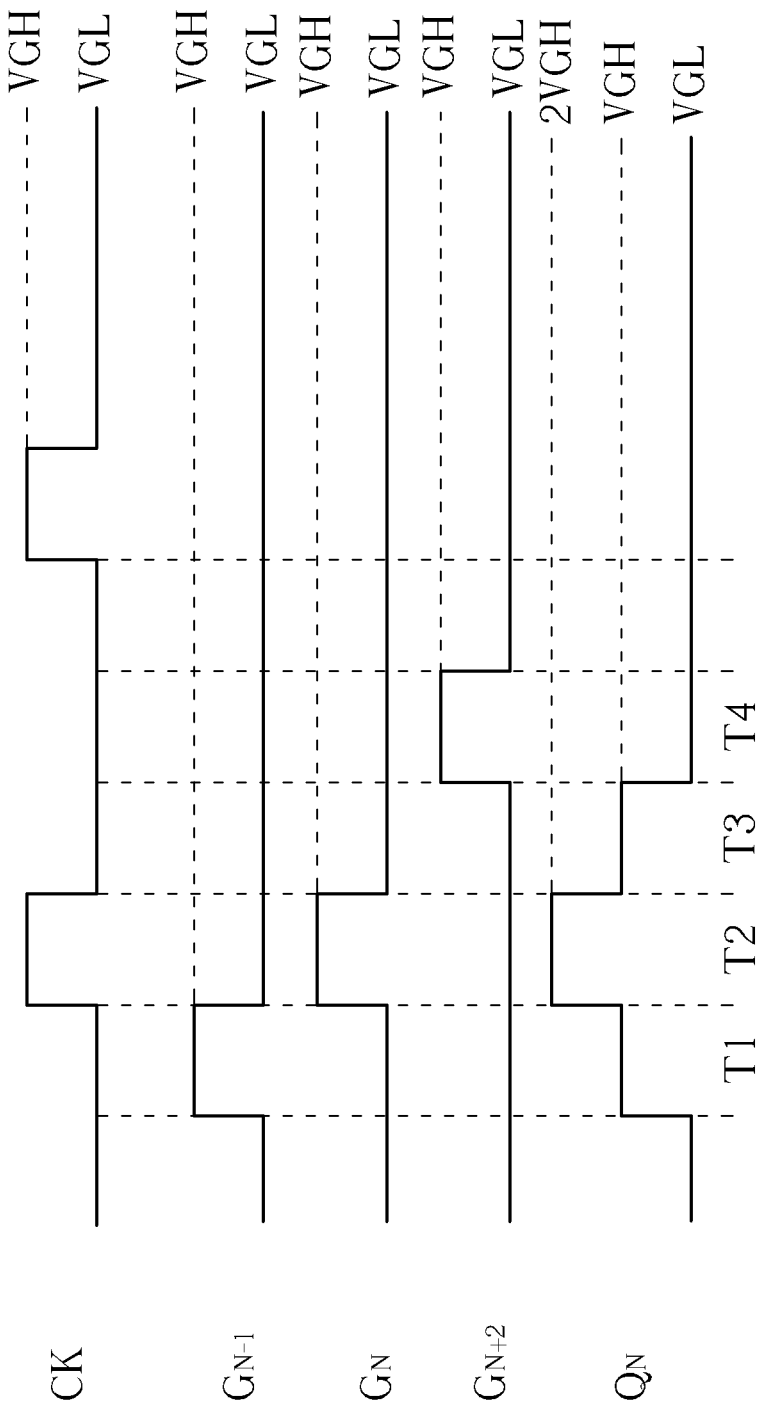
FIG. 2 shows a timing diagram of the shift register circuit in FIG. 1.
Figure 3:
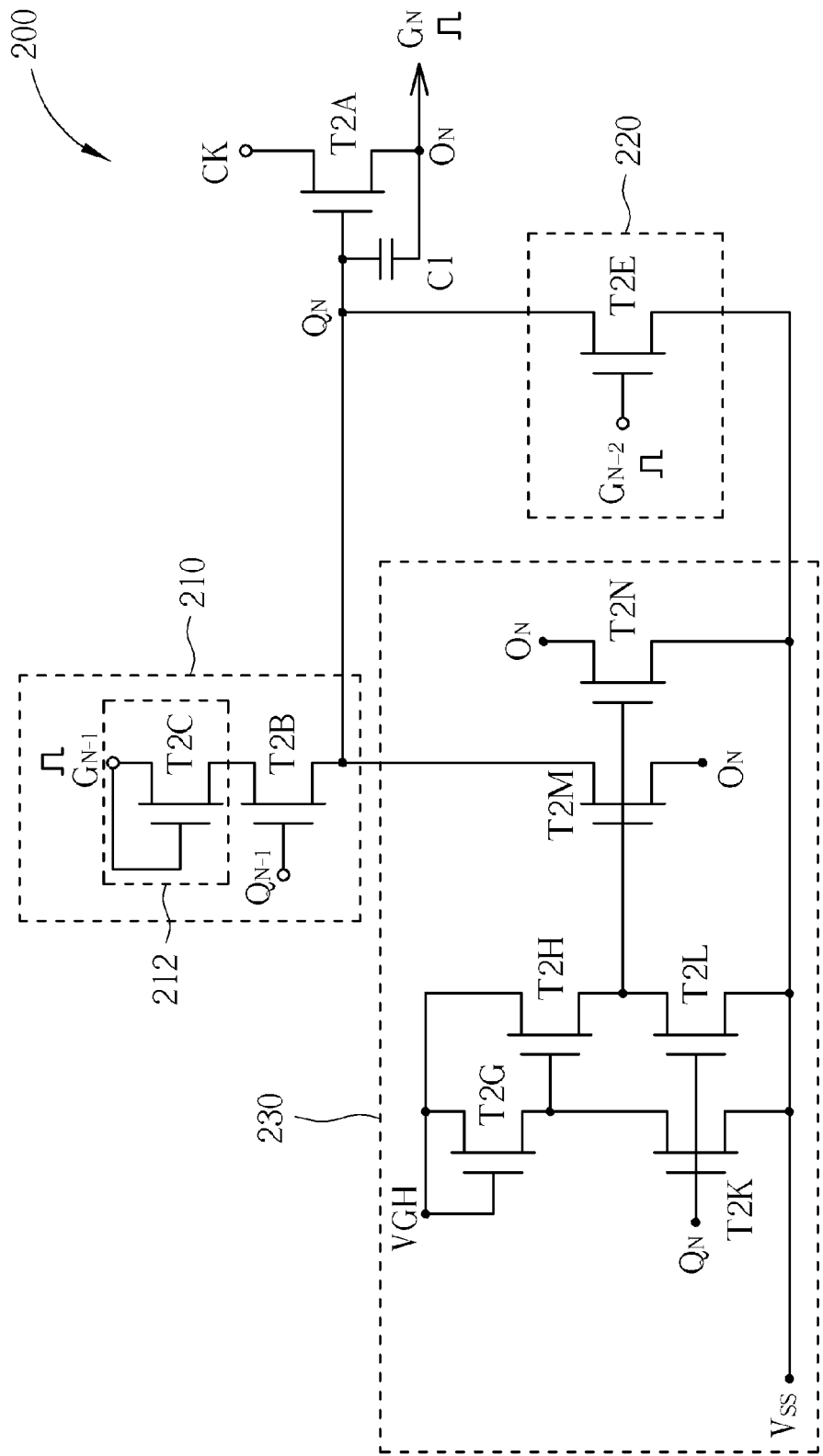
FIG. 3 shows a shift register circuit according to one embodiment of the present invention.
Figure 4:
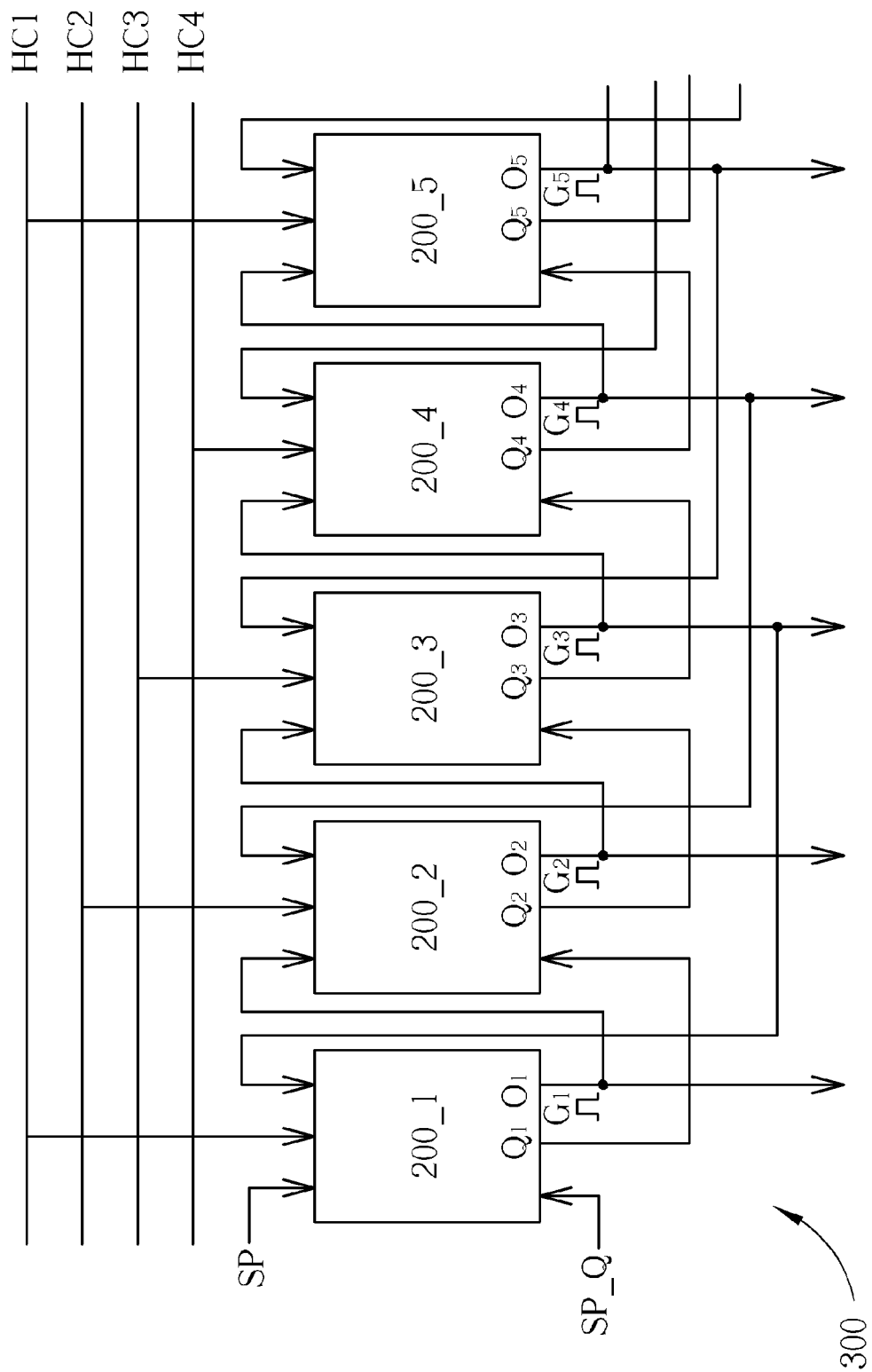
FIG. 4 shows a shift register according to one embodiment of the present invention.

FIG. 3 shows a shift register circuit 200 according to one embodiment of the present invention and FIG. 4 shows a shift register 300 according to one embodiment of the present invention. The shift register 300 includes a plurality of stages of shift register circuit 200_1 to 200_5, and each stage of shift register circuit 200_1 to 200_5 has the same structure as the shift register circuit 200.

The shift register circuit 200 includes a switch T2A, an input circuit 210, a pull-down circuit 220 and a pull-down voltage regulator circuit 230. The switch T2A has a first terminal for receiving a clock signal CK, a second terminal used to output a first scan signal $G_N$ of the shift register circuit 200 as an output terminal $O_N$ of the shift register circuit 200, and a control terminal electrically coupled to a node $Q_N$ of the shift register circuit 200, N is a positive integer. The input circuit 210 comprises a switch T2B and a receiving circuit 212. The switch T2B has a first terminal, a second terminal electrically coupled to the node $Q_N$ of the shift register circuit 200, and a control terminal electrically coupled to a node $Q_{N-1}$ of a previous M-th stage of shift register circuit that is M (M is a positive integer, in this case, M equals to one) stages before the shift register circuit 200 of the plurality of stages of shift register circuit. For example, in FIG. 4, the previous M-th stage of shift register circuit that is M (ex., M equals to one) stage before the shift register circuit 200_2 of the shift register 300 is the shift register circuit 200_1 so the control terminal of the switch T2B of the shift register circuit 200_2 is electrically coupled to the node $Q_1$ of the shift register circuit 200_1. The receiving circuit 212 is electrically coupled to the first terminal of the switch T2B and is used to receive a scan signal $G_{N-1}$ outputted from the previous M-th stage of shift register circuit that is M (ex., M equals to one) stages before the shift register circuit 200 and control a voltage level of the first terminal of the switch T2B according to the scan signal $G_{N-1}$. The pull-down circuit 220 is electrically coupled to the node $Q_N$ of the shift register circuit 200 and used to pull down a voltage level of the node $Q_N$ of the shift register circuit 200 according to a scan signal $G_{N+2}$ outputted from a following L-th stage of shift register circuit that is L stages after the shift register circuit 200 (L can be a positive integer and normally L equals to M+1, in this case, L equals to two). For example, in FIG. 4, the following L-th stage of shift register circuit that is L stages (ex., L equals to two) after the shift register circuit 200_2 of the shift register 300 is the shift register circuit 200_4 so the pull-down circuit 220 of the shift register circuit 200_2 is used to pull down the voltage level of the node $Q_2$ of the shift register circuit 200_2 according to the scan signal $G_4$ of the shift register circuit 200_4. The pull-down voltage regulator circuit 230 is electrically coupled to the node $Q_N$ of the shift register circuit 200 and the second terminal of the switch T2A. The pull-down voltage regulator circuit 230 is used to pull down the voltage level of the node $Q_N$ of the shift register circuit 200 and a voltage level of the second terminal of the switch T2A according to the voltage level of the node $Q_N$ of the shift register circuit 200. In one embodiment of the present invention, the shift register circuit 200 further includes a capacitor C1. The capacitor C1 is electrically coupled between the control terminal of the switch T2A and the second terminal of the switch T2A.

In FIG. 3, the receiving circuit 212 of the shift register circuit 200 includes a switch T2C. The switch T2C has a first terminal for receiving the scan signal $G_{N-1}$ outputted from the previous M-th stage of shift register circuit, ex., M equals to one, a second terminal electrically coupled to the first terminal of the switch T2B, and a control terminal electrically coupled to a first terminal of the switch T2C. The pull-down circuit 220 of the shift register circuit 200 includes a switch T2E. The switch T2E has a first terminal electrically coupled to the node $Q_N$ of the shift register circuit 200, a second terminal electrically coupled to a system voltage terminal $V_{ss}$, and a control terminal for receiving a scan signal $G_{N+2}$ outputted from the following L-th stage of shift register circuit that is L stages (ex., L equals to two) after the shift register circuit 200. The system voltage terminal $V_{ss}$ can be used to provide a low voltage level VGL.

The pull-down voltage regulator circuit 230 of the shift register circuit 200 includes switches T2G, T2H, T2K, T2L, T2M and T2N. The switch T2G has a first terminal for receiving a high voltage level VGH and a control terminal electrically coupled to the first terminal of the switch T2G. The switch T2H has a first terminal electrically coupled to the first terminal of the switch T2G, and a control terminal electrically coupled to the second terminal of the switch T2G. The switch T2K has a first terminal electrically coupled to the second terminal of the switch T2G, a second terminal electrically coupled to the system voltage terminal $V_{ss}$, and a control terminal electrically coupled to the node $Q_N$ of the shift register circuit 200. The switch T2L has a first terminal electrically coupled to the second terminal of the switch T2H, a second terminal electrically coupled to the system voltage terminal $V_{ss}$, and a control terminal electrically coupled to the node $Q_N$ of the shift register circuit 200. The switch T2M has a first terminal electrically coupled to the node $Q_N$ of the shift register circuit 200, a second terminal electrically coupled to the second terminal $O_N$ of the switch T2A, and a control terminal electrically coupled to the second terminal of the switch T2H. The switch T2N has a first terminal electrically coupled to the second terminal $O_N$ of the switch T2A, a second terminal electrically coupled to the system voltage terminal $V_{ss}$, and a control terminal electrically coupled to the second terminal of the switch T2H.

The shift register 300 can be used as a gate driver of a display panel. The plurality of stages of the shift register circuit of the shift register 300 can be used to provide a plurality of gate driving signals to turn on and turn off the pixels of the display panel. In FIG. 4, each of the shift register circuits 200_1 to 200_5 can output a gate driving signal $G_1$ to $G_5$ from its output terminal $O_1$ to $O_5$ to the corresponding gate line (also called scan line) in turn for turning on the corresponding row of pixels in the display panel. The shift register circuits 200_2 to 200_5 receive the gate driving signal $G_1$ to $G_4$ from the shift register circuits 200_1 to 200_4 that are one stage therebefore, respectively. The shift register circuit 200_1 receives a first initial signal SP. In addition, the shift register circuits 200_2 to 200_5 are electrically coupled to nodes $Q_1$ to $Q_4$ of the prior shift register circuits 200_1 to 200_4, respectively, and the shift register circuit 200_1 receives a second initial signal SP_Q. The shift register circuits 200_1 to 200_3 are electrically coupled to the output terminals $O_3$ to $O_5$ of the shift register circuits 200_3 to 200_5 that are L stages thereafter, ex., L equals to two, respectively. In one embodiment, the shift register circuits 200_1 may output the gate driving signal $G_1$ firstly, and then the shift register circuits 200_2, 200_3, 200_4 can output the gate driving signal $G_2$, $G_3$, and $G_4$ in turn. The shift register circuit 200_5 is the last shift register to output the driving signal $G_5$ among the five shift register circuits 200_1 to 200_5.

Figure 5:
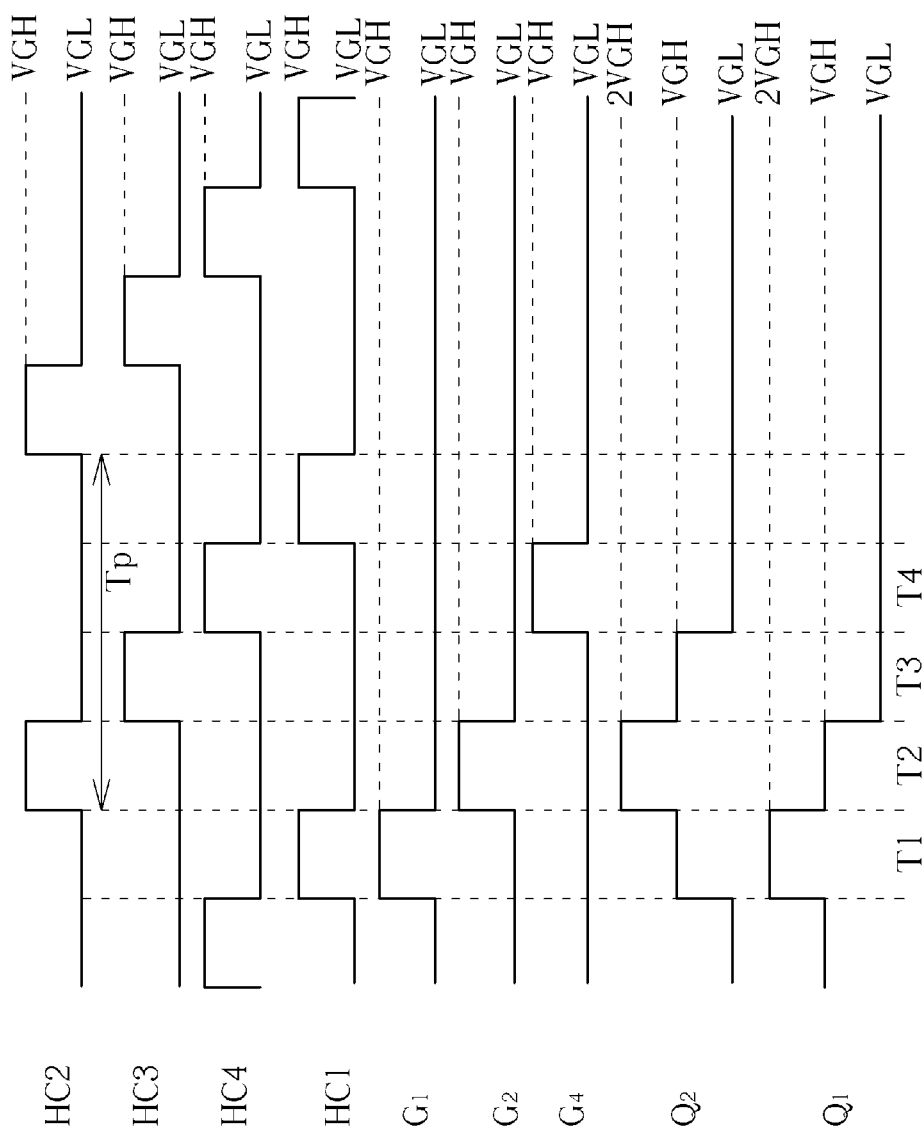
FIG. 5 shows a timing diagram of the shift register in FIG. 4.

Furthermore, the shift register circuits 200_1 to 200_5 receive the clock signals HC1, HC2, HC3, HC4 and HC1 respectively. The voltage levels of the clock signals HC1, HC2, HC3 and HC4 are switching between the high voltage level VGH and the low voltage level VGL. Each of the clock signals HC1, HC2, HC3 and HC4 is provided with the high voltage level VGH once during a period, and the clock signals HC1, HC2, HC3 and HC4 are not provided with the high voltage level VGH at the same time. In FIG. 5, the period of the clock signals HC1, HC2, HC3, and HC4 is $T_p$, and the clock signals HC1, HC2, HC3, and HC4 are changing to the high voltage level VGH at different timing T1, T2, T3, and T4 in the period $T_p$, sequentially. In one embodiment of the present invention, the clock signal HC2 is a quarter of period $T_p$ behind the clock signal HC1, the clock signal HC3 is half of period $T_p$ behind the clock signal HC1, and the clock signal HC4 is three quarters of period $T_p$ behind the clock signal HC1. However, the timing and phases of the present invention is not limited to the aforesaid embodiments.

In addition, in one embodiment of the present invention, the shift register 300 can be operated according to the four clock signals HC1 to HC4, and thus is called a four-phase shift register circuit. Consequently, the clock signal received by the Nth stage of shift register circuit in shift register 300 is the same as the clock signal received by the (N+4)th stage of shift register circuit in the shift register 300, wherein N is a positive integer. For example, the first shift register circuit 200_1 receives the clock signal HC1, and the fifth shift register 200_5 also receives the clock signal HC1. However, the present invention is not limited to the aforesaid example. One can also expand the phase number of the shift register 300 to eight or other numbers according to the system needs.

FIG. 5 shows the timing diagram of the shift register circuit 200_2 of the shift register 300 in FIG. 4. During the duration of T1, the clock signal HC2 (can also be referenced as the clock signal CK as shown in FIG. 3) is at the low voltage level VGL, the scan signal $G_1$ is at the high voltage level VGH, the scan signal $G_4$ is at the low voltage level VGL, and the voltage level of the node $Q_1$ of the shift register circuit 200_1 is two times the high voltage level, namely, 2VGH. The switch T2C is turned on. Because the node $Q_1$ of the shift register circuit 200_1 has a higher voltage level, the voltage gap between the control terminal of the switch T2B and the second terminal of the switch T2B is rather large and the voltage level of the node $Q_2$ can, thus, be pulled up to be close to the high voltage level VGH. The switch T2A is turned on so the voltage level of the scan signal $G_2$ is kept at the same low voltage level VGL as the clock signal HC2. The switches T2G, T2K, and T2L are turned on. Since the driving power of the switch T2K is greater than the driving power of the switch T2G, the control terminal of the switch T2H is kept at the low voltage level and is turned off. The voltage level of the second terminal of the switch T2H is kept at the low voltage level by the turned-on switch T2L so the switches T2M and T2N are turned off. The switch T2E is also turned off.

During the duration of T2, the scan signal $G_1$ is changed to the low voltage level VGL, the scan signal $G_4$ is kept at the low voltage level VGL, the clock signal HC2 is changed to the high voltage level VGH, and the voltage level of the node $Q_1$ of the shift register circuit 200_1 is at the high voltage level VGH. During this duration, the switch T2C is turned off. The first terminal and the control terminal of the switch T2B are both at the high voltage level VGH so the switch T2B is turned off. The switch T2A is still turned on and pulls up the voltage level of the scan signal $G_2$ to the high voltage level VGH as the clock signal HC2. The voltage level of node $Q_2$ is pulled up to a voltage level that is two times the high voltage level VGH (namely, 2VGH) due to the coupling effect of C1. The switches T2G, T2K and T2L are still turned on and the switches T2H, T2M, T2N and T2E are still turned off.

In addition, during the duration of T2, since the switches T2B and T2C are turned off, there's no flowing path for currents at the first terminal of the switch T2B so the first terminal of the switch T2B is kept at the high voltage level VGH firstly and the source-drain voltage gap $V_{ds}$ of the switch T2B is about the same as the high voltage level VGH. Consequently, the current leakage on the node $Q_N$ due to the large source-drain voltage gap $V_{ds}$ (about two times the high voltage level 2VGH) as shown in the prior art can be reduced and the issue of weak driving power due to the current leakage can also be improved.

Also, since the voltage level of the node $Q_1$ of the shift register circuit 200_1 is still at the high voltage level VGH, the voltage levels of the control terminal and the second terminal of the switch T2B can also be the same, which can help to prevent the current leakage from increasing due to the over backward bias voltage of the gate-source voltage gap $V_{gs}$ of the switch T2B.

During the duration of T3, the scan signal $G_1$ and $G_4$ remain at the low voltage level VGL, the clock signal HC2 is changed to the low voltage level VGL, and the voltage level of the node $Q_1$ of the shift register circuit 200_1 is at the low voltage level VGL. During this duration, the switches T2B and T2C are turned off, and the switch T2A is kept turned on so as to pull down the voltage level of the scan signal $G_2$ to the same low voltage level VGL as the clock signal HC2. The switches T2G, T2K and T2L are still turned on and the switches T2H, T2M, T2N and T2E are still turned off.

During the duration of T4, the scan signal $G_1$ remains at the low voltage level VGL, the scan signal $G_4$ is changed to the high voltage level VGH, the clock signal HC2 is still at the low voltage level VGL, and the voltage level of the node $Q_1$ of the shift register circuit 200_1 is still at the low voltage level VGL. The switches T2B and T2C are turned off and the switch T2E is turned on so the voltage level of the node $Q_2$ is pulled down to the low voltage level VGL. Thus, the switches T2A, T2K, T2L are turned off and the switch T2G is still turned on so the switches T2H, T2M and T2N are turned on, making the voltage levels of the node $Q_2$ and the scan signal $G_2$ stay at the low voltage level VGL stably.

According to the aforesaid embodiment, the receiving circuit 212 and the switch T2B of the shift register circuit 200_2 can reduce the voltage difference between the first terminal and the second terminal of the switch T2B and make the voltage level of the control terminal of the switch T2B equal to the voltage level of the first terminal of the switch T2B according to the voltage level of the node $Q_1$ of the shift register circuit 200_1 that is M stages before the shift register circuit 200_2 (ex., one stage before) and the scan signal $G_1$ outputted from the shift register circuit 200_1 that is M stages before the shift register circuit 200_2 (ex., M equals to one) so that the current leakage on the node $Q_2$ of the shift register circuit 200_2 can be reduced, and the waveform of the gate driving signal outputted by the shift register 300 can be preserved, preventing the wrong charging of the display panel.

Figure 6:
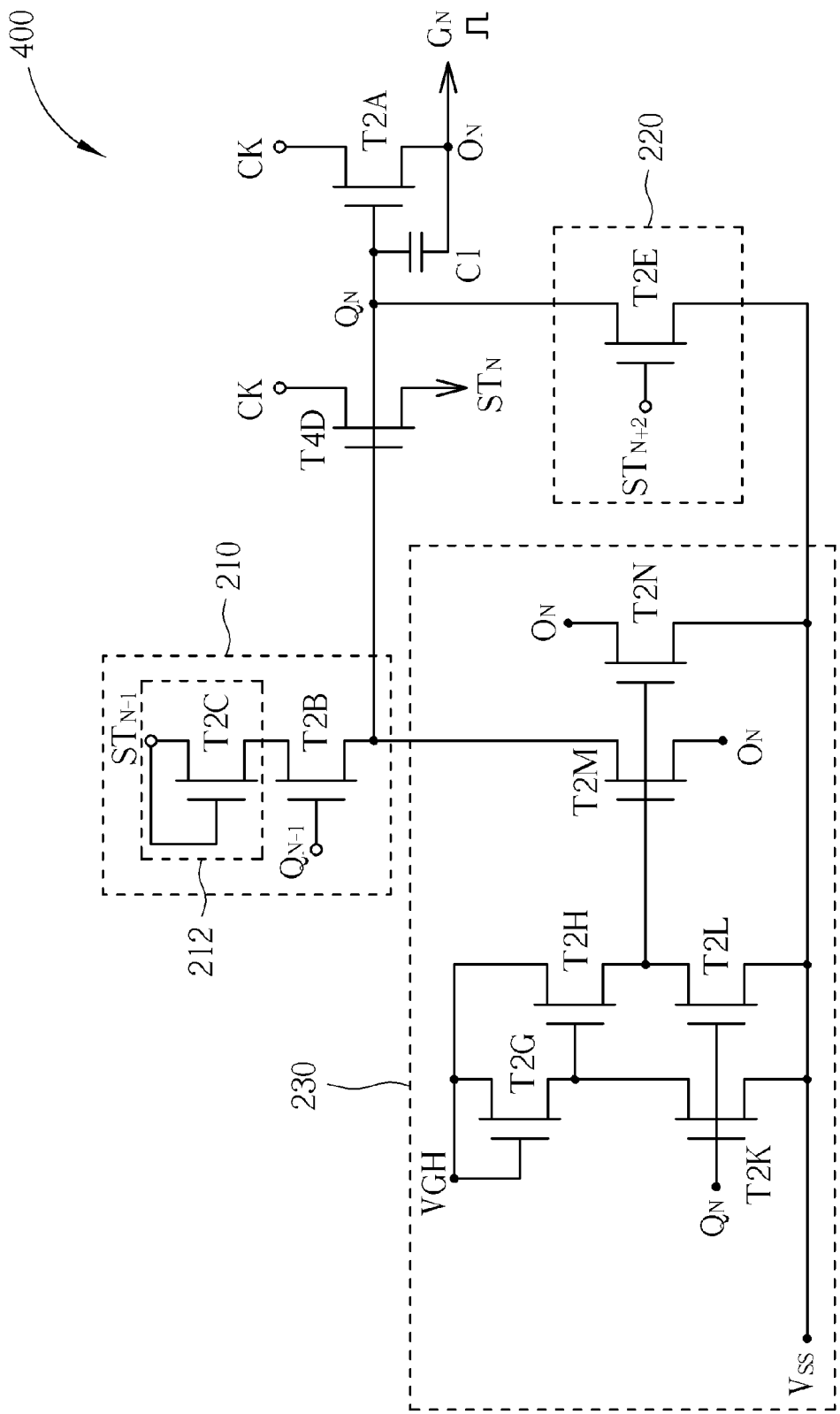
FIG. 6 shows a shift register circuit according to another embodiment of the present invention.

Furthermore, when using the shift register of the present invention as the gate driving circuit for a display panel, the output scan signal may be affected by the loading of the display panel, which may make the waveform transition not fast enough and cause error. FIG. 6 shows a shift register circuit 400 according to one embodiment of the present invention. The difference between the shift register circuit 400 and the shift register circuit 200 is that the shift register circuit 400 further includes switches T4D. The switch T4D has a first terminal for receiving the clock signal CK, a second terminal used for outputting a scan signal $ST_N$, and a control terminal electrically coupled to the node $Q_N$ of the shift register circuit 400. Since the structural connection of the switch T4D is the same as the switch T2A, the scan signals $S_{TN}$ and $G_N$ have the same timing and voltage level. The scan signal $G_N$ can be used to serve as the scan signal of the display panel and the scan signal $ST_N$ is not; therefore, the waveform transition of the scan signal $S_{TN}$ is more accurate. Consequently, the receiving circuit 212 can receive the scan signals $G_{N-1}$ or $ST_{N-1}$ from the shift register circuit that is M stages, ex., M equals to one, before the shift register circuit 400 and control the voltage level of the first terminal of the T2B according to the scan signals $G_{N-1}$ or $ST_{N-1}$. Also, the pull-down circuit 220 of the shift register 400 can pull down the voltage level of the node $Q_N$ of the shift register circuit 400 according to the scan signals $G_{N+2}$ or $ST_{N+2}$ outputted from the following L-th stage of shift register circuit that is L stages (ex., L equals to two) after the shift register circuit 400.

Figure 7:
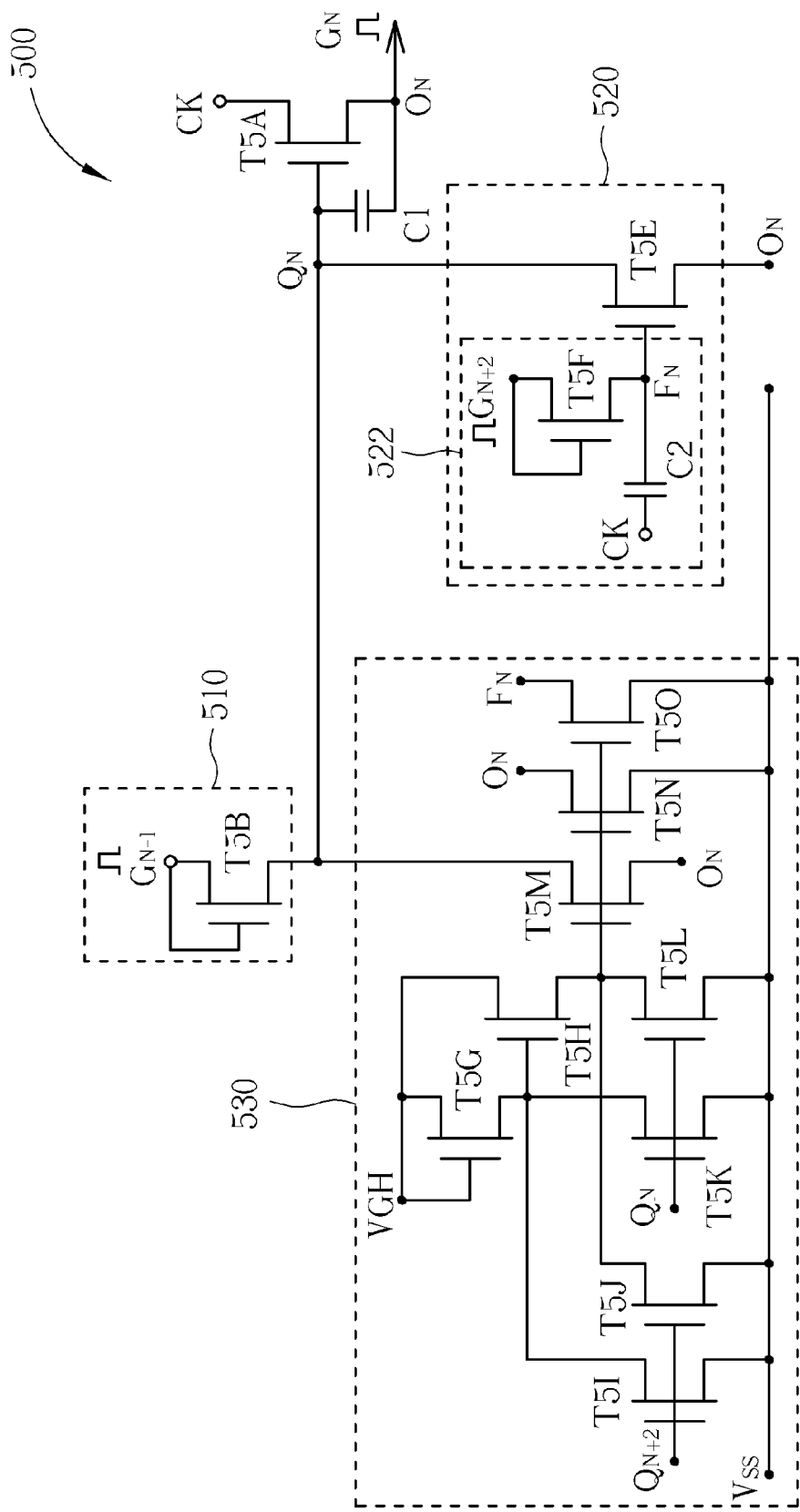
FIG. 7 shows a shift register circuit according to another embodiment of the present invention.
Figure 8:
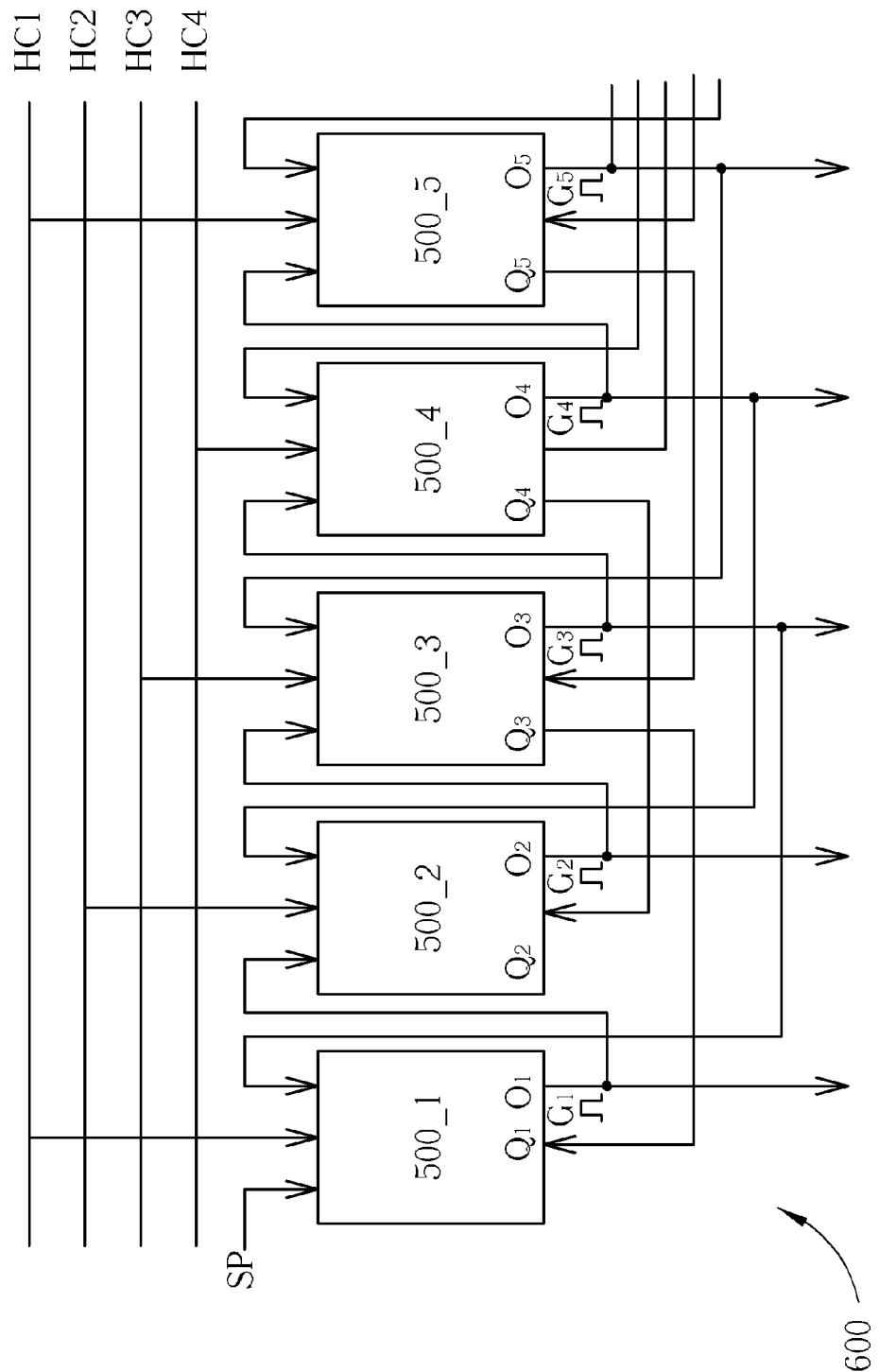
FIG. 8 shows a shift register according to another embodiment of the present invention.

FIG. 7 shows a shift register circuit 500 and FIG. 8 shows a shift register 600. The shift register 600 includes a plurality of stages of shift register circuits 500_1 to 500_5, and each stage of shift register circuits 500_1 to 500_5 has the same structure as the shift register circuit 500. The shift register circuit 500 includes a switch T5A, an input circuit 510, a pull-down circuit 520 and a pull-down voltage regulator circuit 530. The switch T5A has a first terminal for receiving a clock signal CK, a second terminal used to output a first scan signal $G_N$ of the shift register circuit 500 as an output terminal $O_N$ of the shift register circuit 500, and a control terminal electrically coupled to a node $Q_N$ of the shift register circuit 500. The input circuit 510 is used to receive a scan signal $G_{N-1}$ outputted from a previous M-th stage of shift register circuit that is M stages (ex., M equals to one) before the shift register circuit 500 and pulls up the voltage level of the node $Q_N$ of the shift register circuit 500 according to the scan signal $G_{N-1}$. For example, in FIG. 8, the previous M-th stage of shift register circuit that is M (ex., M equals to one) stages before the shift register circuit 500_2 in the shift register 600 is the shift register circuit 500_1 so the input circuit of the shift register circuit 500_2 is used to receive the scan signal $G_1$ outputted from the shift register circuit 500_1. The pull-down circuit 520 includes a switch T5E and a pull-down controlling circuit 522. The switch T5E has a first terminal electrically coupled to the node $Q_N$ of the shift register circuit 500, a second terminal electrically coupled to the second terminal of the switch T5A, and a control terminal $F_N$. The pull-down controlling circuit 522 is electrically coupled to the control terminal $F_N$ of the switch T5E and is used to receive the clock signal CK and the scan signal $G_{N+2}$ outputted from a following L-th stage of shift register circuit that is L stages (ex., L equals to two) after the shift register circuit 500. For example, in FIG. 8, the following L-th stage of shift register circuit that is L stages (ex., L equals to two) after the shift register circuit 500_2 of the shift register 600 is the shift register circuit 500_4 so the pull-down circuit of the shift register circuit 500_2 is used to receive the scan signal $G_4$ outputted from the shift register circuit 500_4. In addition, the pull-down controlling circuit 522 can receive the clock signal CK and the scan signal $G_{N+2}$ outputted from the following L-th stage of shift register circuit that is L stages after the shift register circuit 500 to pull up the voltage level of the control terminal $F_N$ of the switch T5E when the scan signal $G_N$ and the clock signal CK are of the high voltage level VGH and to pull up the voltage level of the control terminal $F_N$ of the switch T5E for pulling down the voltage level of the node $Q_N$ of the current stage of shift register circuit when the scan signal $G_{N+2}$ is of the high voltage level VGH. The pull-down voltage regulator circuit 530 is electrically coupled to the node $Q_N$ of the shift register circuit 500, the second terminal of the switch T5A, and the node $Q_{N+2}$ of the following L-th stage of shift register circuit that is L stages (ex., L equals to two) after the shift register circuit 500. The pull-down voltage regulator circuit 530 is used to pull down the voltage level of the node $Q_N$ of the shift register circuit 500 and the voltage level of the second terminal of the switch T5A according to the voltage level of the node $Q_N$ of the shift register circuit 500. In one embodiment of the present invention, the shift register circuit 500 further includes a capacitor C1. The capacitor C1 is electrically coupled between the control terminal of the switch T5A and the second terminal of the switch T5A.

In FIG. 7, the input circuit 520 includes a switch T5B. The switch T5B has a first terminal for receiving the scan signal $G_{N-1}$ outputted from the previous M-th stage of shift register circuit, ex., M equals to one, a second terminal electrically coupled to the node $Q_N$ of the shift register circuit 500, and a control terminal electrically coupled to the first terminal of the switch T5B. Furthermore, the pull-down controlling circuit 522 of the shift register circuit 500 includes a capacitor C2 and a switch T5F. The capacitor C2 has a first terminal for receiving the clock signal CK and a second terminal electrically coupled to the control terminal $F_N$ of the switch T5E. The switch T5F has a first terminal for receiving the scan signal $G_{N+2}$ outputted from the following L-th stage of shift register circuit that is L stages (ex., L equals to two) after the shift register circuit 500, a second terminal electrically coupled to the second terminal of the capacitor C2, and a control terminal electrically coupled to the first terminal of the switch T5F.

The pull-down voltage regulator circuit 530 of the shift register circuit 500 includes switches T5G, T5H, T5I, T5J, T5K, T5L, T52M, T5N, and T5O. The switch T5G has a first terminal for receiving the high voltage level VGH, and a control terminal electrically coupled to the first terminal of the switch T5G. The switch T5H has a first terminal electrically coupled to the first terminal of the switch T5G, and a control terminal electrically coupled to the second terminal of the switch T5G. The switch T5I has a first terminal electrically coupled to the second terminal of the switch T5G, a second terminal electrically coupled to the system voltage terminal Vss, and a control terminal electrically coupled to the node $Q_{N+2}$ of the following L-th stage of shift register circuit that is L stages (ex., L equals to two) after the shift register circuit 500. The switch T5J has a first terminal electrically coupled to a second terminal of the switch T5H, a second terminal electrically coupled to the system voltage terminal Vss, and a control terminal electrically coupled to the node $Q_{N+2}$ of the following L-th stage of shift register circuit, ex., L equals to two. The switch T5K has first terminal electrically coupled to the second terminal of the switch T5G, a second terminal electrically coupled to the system voltage terminal Vss, and a control terminal electrically coupled to the node $Q_N$ of the shift register circuit 500. The switch T5L has a first terminal electrically coupled to the second terminal of the switch T5H, a second terminal electrically coupled to the system voltage terminal Vss, and a control terminal electrically coupled to the node $Q_N$ of the shift register circuit 500. The switch T5M has a first terminal electrically coupled to the node $Q_N$ of the shift register circuit 500, a second terminal electrically coupled to the second terminal of the switch T5A, and a control terminal electrically coupled to the second terminal of the switch T5H. The switch T5N has a first terminal electrically coupled to the second terminal of the switch T5A, a second terminal electrically coupled to the system voltage terminal Vss, and a control terminal electrically coupled to the second terminal of the switch T5H. The switch T5O has a first terminal electrically coupled to the control terminal $F_N$ of the switch T5E, a second terminal electrically coupled to the system voltage terminal Vss, and a control terminal electrically coupled to the second terminal of the switch T5H.

The shift register 600 can be used as a gate driver of a display panel. The plurality of stages of the shift register circuit of the shift register 600 can be used to provide a plurality of gate driving signals to turn on and turn off the pixels of the display panel. In FIG. 8, each of the shift register circuits 500_1 to 500_5 can output a gate driving signal $G_1$ to $G_5$ from its output terminal $O_1$ to $O_5$ to the corresponding gate line (also called scan line) in turn for turning on the corresponding row of pixels in the display panel. The shift register circuits 500_2 to 500_5 receive the gate driving signal $G_1$ to $G_4$ from the prior shift register circuits 500_1 to 500_4, respectively. The shift register circuit 500_1 receives a first initial signal SP. In addition, the shift register circuits 500_1 to 500_3 are electrically coupled to nodes $Q_3$ to $Q_5$ and the output terminals $O_3$ to $O_5$ of the shift register circuits 500_3 to 500_5 that are L stages thereafter (ex., L equals to two), respectively. In one embodiment, the shift register circuit 500_1 may output the gate driving signal $G_1$ firstly, and then the register circuits 500_2, 500_3, 500_4 can output the gate driving signal $G_2$, $G_3$, and $G_4$ in turn. The shift register circuit 500_5 is the last shift register to output the driving signal $G_5$ among the five shift register circuits 500_1 to 500_5.

Figure 9:
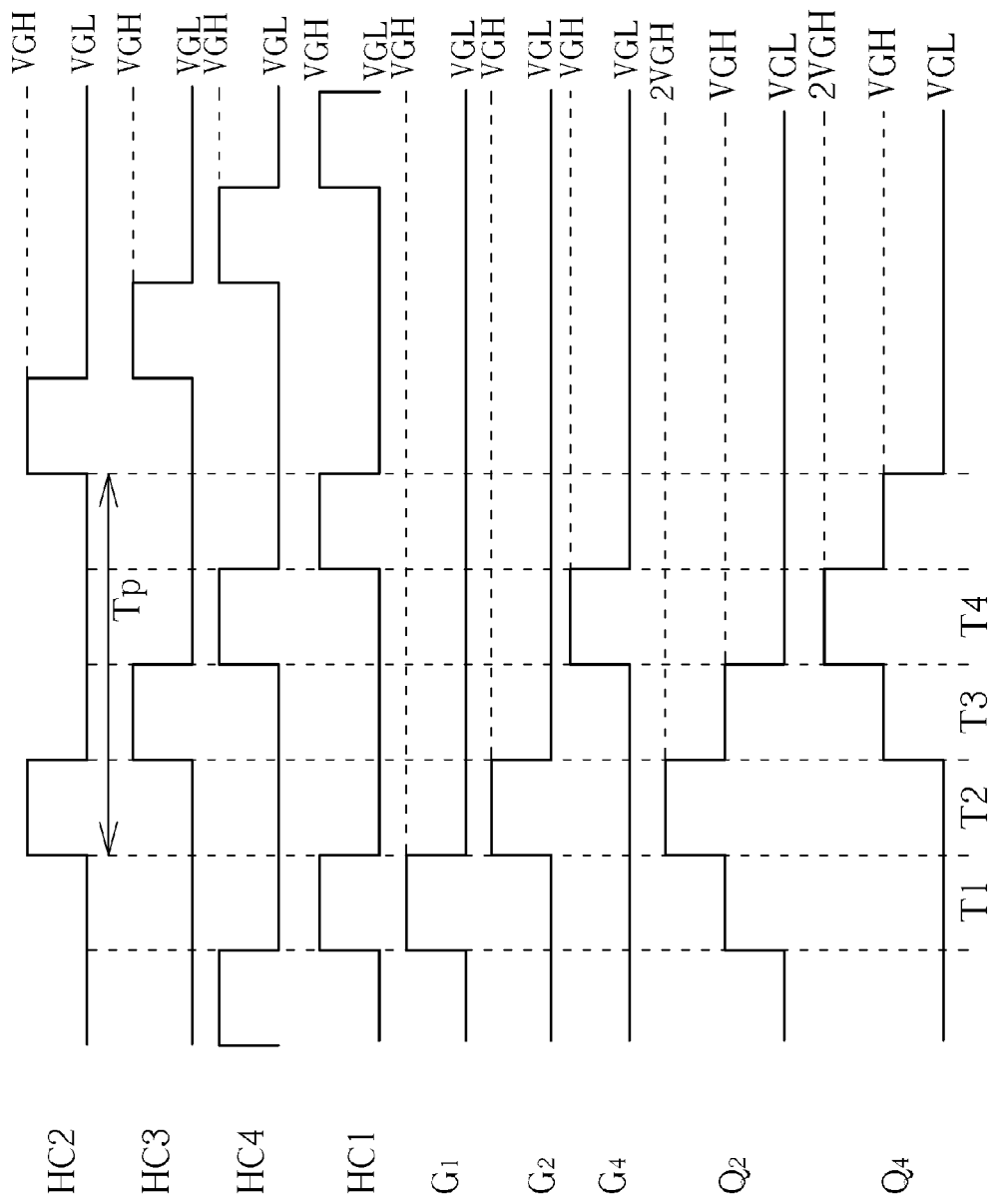
FIG. 9 shows a timing diagram of the shift register in FIG. 8.

Furthermore, the shift register circuits 500_1 to 500_5 receive the clock signals HC1, HC2, HC3, HC4 and HC1, respectively. The voltage levels of the clock signals HC1, HC2, HC3 and HC4 are switching between the high voltage level VGH and the low voltage level VGL. Each of the clock signals HC1, HC2, HC3 and HC4 is provided with the high voltage level VGH once during a period, and the clock signals HC1, HC2, HC3 and HC4 are not provided with the high voltage level VGH at the same time. In FIG. 9, the period of the clock signals HC1, HC2, HC3, and HC4 is $T_p$, and the clock signals HC1, HC2, HC3, and HC4 are changing to the high voltage level VGH at different timing T1, T2, T3, and T4 in the period $T_p$, sequentially. In one embodiment of the present invention, the clock signal HC2 is a quarter of period $T_p$ behind the clock signal HC1, the clock signal HC3 is half of period $T_p$ behind the clock signal HC1, and the clock signal HC4 is three quarters of period $T_p$ behind the clock signal HC1. However, the timing and phases of the present invention is not limited to the aforesaid embodiments.

FIG. 9 shows the timing diagram of the shift register circuit 500_2 of the shift register 600 in FIG. 8. During the duration of T1, the clock signal HC2 is at the low voltage level VGL, the scan signal $G_1$ is at the high voltage level VGH, the scan signal $G_4$ is at the low voltage level VGL, and the voltage level of the node $Q_4$ of the shift register circuit 500_4 is at the low voltage level VGL. The switch T5B of the shift register circuit 500_2 is turned on and the voltage level of the node $Q_2$ of the shift register circuit 500_2 is pulled up to the high voltage level VGH. Thus, the switch T5A is turned on so the voltage level of the scan signal $G_2$ is controlled at the low voltage level as the clock signal HC2. The switch T5G, T5K and T5L are turned on. However, since the driving power of the switch T5K is greater than the driving power of the switch T5G, the voltage level of the control terminal of the switch T5H is kept at the low voltage level VGL and the switch T5H is turned off. The voltage level of the second terminal of the switch T5H is also kept at the low voltage level VGL by the turned-on switch T5L, thus turning off the switches T5M, T5N and T5O. Also the switches T5E, T5F, T5I and T5J are turned off.

During the duration of T2, the scan signal $G_1$ is changed to the low voltage level VGL, the scan signal $G_4$ is kept at the low voltage level VGL, the clock signal HC2 is changed to the high voltage level VGH, and the voltage level of the node $Q_4$ of the shift register circuit 500_4 is still at the low voltage level VGL. During this duration, the switch T5B is turned off and the switch T5A is still turned on to pull up the voltage level of the scan signal $G_2$ to the high voltage level VGH as the clock signal HC2. The voltage level of node $Q_2$ is pulled up to a voltage level that is two times the high voltage level (namely, 2VGH) due to the coupling effect of C1. The switches T5G, T5K and T5L are still turned on and the switches T5H, T5I, T5J, T5M, T5N and T5O are still turned off. The switch T5F is turned off.

Figure 10:
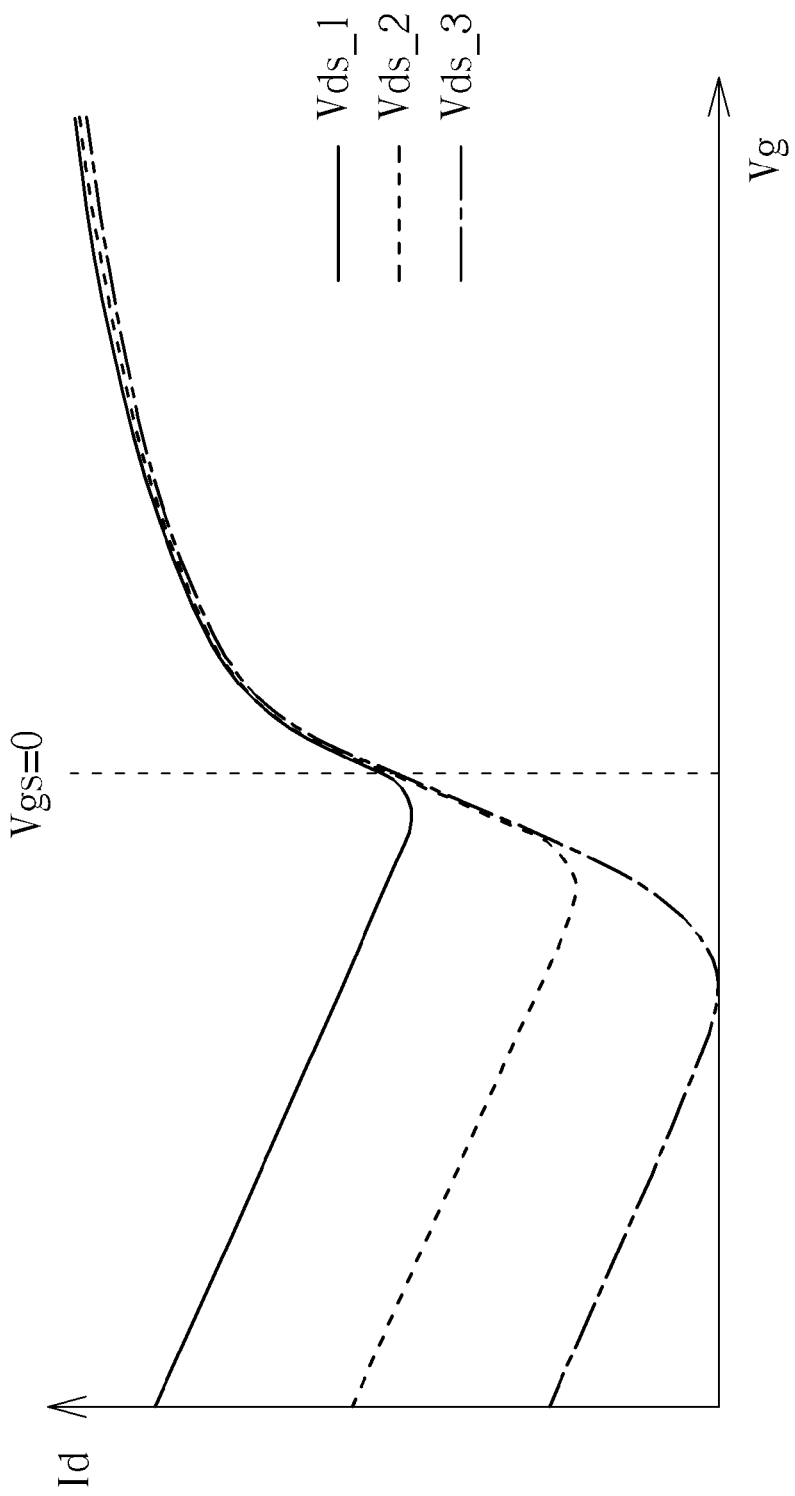
FIG. 10 shows a relation between a driving current and a voltage of a common transistor.

In addition, during the duration of T2, since the clock signal HC2 is at the high voltage level VGH, the control terminal $F_N$ and the second terminal of the switch T5E have the same voltage level so the switch T5E is turned off. Also, since the second terminal of the switch T5E is electrically coupled to the output terminal $O_2$, the source-drain voltage gap $V_{ds}$ of the switch T5E is about the high voltage level VGH. FIG. 10 shows a relation between a driving current $I_d$, a gate voltage $V_g$ and the source-drain voltage gap $V_{ds}$ for a common transistor. In FIG. 10, the relation between the source-drain voltage gap $V_{ds\_1}$, $V_{ds\_2}$ and $V_{ds\_3}$ is $V_{ds\_1} > V_{ds\_2} > V_{ds\_1}$. Therefore, even when the gate-source voltage gap Vgs is close to zero, the large source-drain voltage gap $V_{ds}$ can still cause significant current leakage as shown in FIG. 10. Therefore, by reducing the source-drain voltage gap $V_{ds}$ of the switch T5E, the current leakage on the node $Q_N$ due to the large source-drain voltage gap $V_{ds}$ (about two times the high voltage level 2VGH) as shown in the prior art can be reduced and the issue of weak driving power due to the current leakage can also be improved. Also, since the control terminal $F_N$ and the second terminal of the switch T5E have the voltage level, the current leakage caused by the over backward bias voltage on the gate-source voltage $V_{gs}$ of the switch can be prevented.

During the duration of T3, the scan signal $G_1$ and $G_4$ are both kept at the low voltage level VGL, the clock signal HC2 is changed to the low voltage level VGL, and the voltage level of the node $Q_4$ of the shift register circuit 500_4 is at the high voltage level VGH. The switch T5B is turned off and the switch T5A is kept turned on to pull down the scan signal $G_2$ to the same low voltage level VGL as the clock signal HC2. The switches T5G, T5I, T5J, T5K, and T5L are turned on and the switches T5H, T5M, T5N and T5O are turned off. The switches T5E and T5F are turned off.

During the duration of T4, the scan signal $G_1$ is at the low voltage level VGL, the scan signal $G_4$ is changed to the high voltage level VGH, the clock signal HC2 is still at the low voltage level VGL, and the voltage level of the node $Q_4$ of the shift register circuit 500_4 is changed to two times the high voltage level 2VGH. The switch T5B is turned off and the switches T5E and T5F are turned on so the voltage level of the node $Q_2$ is pulled down to the low voltage level VGL. Thus, the switches T5A, T5K, and T5L are turned off and the switch T5G is still turned on. However, because the switches T5I and T5J are still turned on, the second terminals of the switches T5G and T5H are both pulled down to the low voltage level VGL so that the switches T5H, T5M, T5N, and T5O are all turned off. Therefore, the voltage level of the control terminal $F_N$ of the switch T5E will not be pulled down and the switch T5E can be turned on to keep the voltage level of the node $Q_2$ at the low voltage level stably.

According to the aforesaid embodiments, the pull-down controlling circuit 522 of the shift register circuit 500_2 can pull up the voltage level of the control terminal $F_N$ of the switch T5E to the same voltage level as the second terminal of the switch T5E and turn off the switch T5E when the scan signal $G_2$ outputted from the shift register circuit 500_2 is at the high voltage level VGH. Also, since the second terminal of the switch T5E of the shift register circuit 500_2 is electrically coupled to the output terminal $O_2$, the source-drain voltage gap Vds of the switch T5E can be reduced so that the current leakage on the node $Q_2$ of the shift register circuit 500_2 can also be reduced and the correctness of the waveform of the gate driving signal outputted from the shift register 600 can be preserved, preventing the wrong charging of the display panel.

Figure 11:
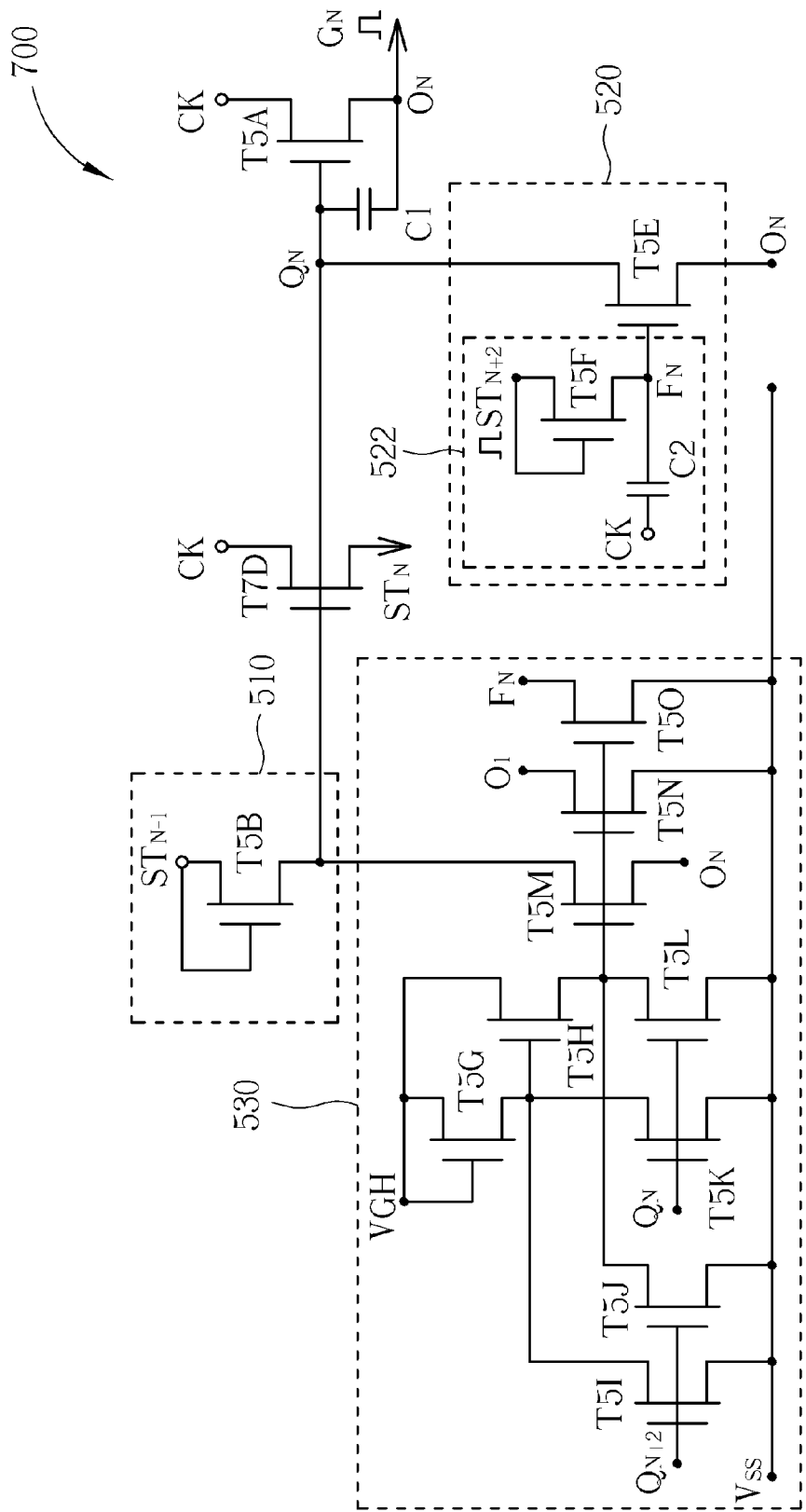
FIG. 11 shows a shift register circuit according to another embodiment of the present invention.

Also, when using the shift register of the present invention as the gate driving circuit for a display panel, the output scan signal may be affected by the loading of the display panel, which may make the waveform transition not fast enough and cause error. FIG. 11 shows a shift register circuit 700 according to one embodiment of the present invention. Comparing to shift register circuit 500, the shift register circuit 700 further includes a switch T7D. The switch T7D has first terminal for receiving the clock signal CK, a second terminal used for outputting a scan signal STN, and a control terminal electrically coupled to the node $Q_N$ of the shift register circuit 700. Since the structural connection of the switch T7D is the same as the switch T5A, the scan signals $ST_N$ and $G_N$ have the same timing and voltage level. Since the scan signal $ST_N$ is not used to output scan signal of the display panel, the waveform transition can be more accurate. Consequently, the input circuit 510 can receive the scan signals $G_{N-1}$ or $ST_{N-1}$ from the previous M-th stage of shift register circuit, ex., M equals to one, and the pull-down controlling circuit 522 can receive the scan signals $G_{N+2}$ or $ST_{N+2}$ outputted from the following L-th stage of shift register circuit, ex., L equals to two.

Figure 12:
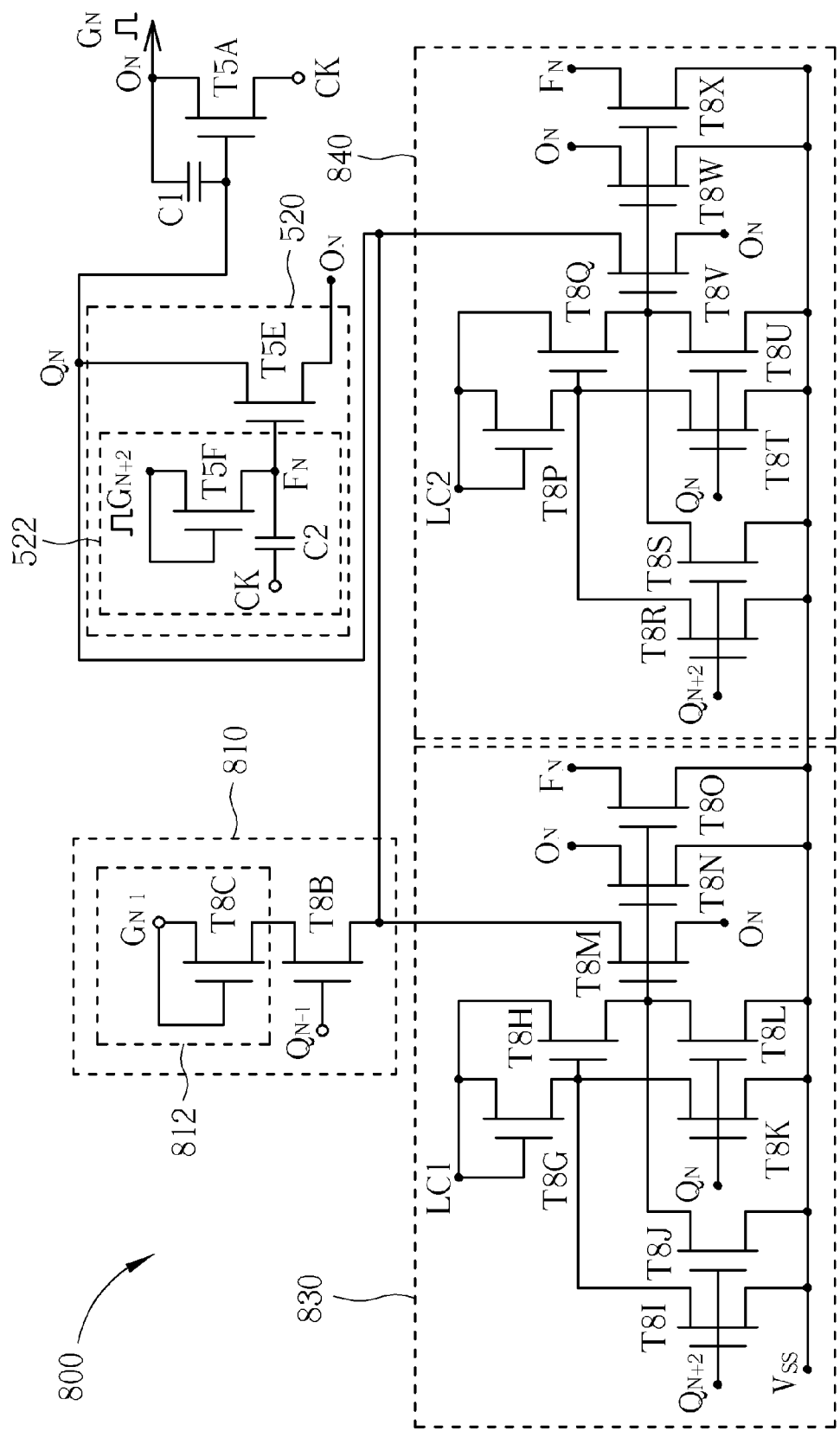
FIG. 12 shows a shift register circuit according to another embodiment of the present invention.

FIG. 12 shows a shift register circuit 800 according to one embodiment of the present invention. The switch T5A and the pull-down circuit 520 of the shift register circuit 800 have the same structure as the switch T5A and the pull-down circuit 520 of the shift register circuit 500 respectively. In addition, the shift register circuit 800 further includes input circuit 810, a first pull down voltage regulator circuit 830 and a second pull down voltage regulator circuit 840. The input circuit 810 includes a switch T8B and a receiving circuit 812. The switch T8B has a second terminal electrically coupled to the node $Q_N$ of the shift register circuit 800, and a control terminal electrically coupled to a node $Q_{N-1}$ of the previous M-th stage of shift register circuit that is M stages (ex., M equals to one) therebefore. The receiving circuit 812 is used to receive a scan signal $G_{N-1}$ outputted from the previous M-th stage of shift register (ex., M equals to one) and when the scan signal $G_N$ is at the high voltage level VGH, reduces the voltage gap between the first terminal of the switch T8B and the node $Q_N$ of the shift register circuit 800 and makes the voltage level of the control terminal of the switch T8B equal to the first terminal of the switch T8B so that the current leakage on the node $Q_N$ of the shift register circuit 800 can be reduced. The first pull-down voltage regulator circuit 830 and the second pull-down voltage regulator circuit 840 have the same structures. Both of the circuits are electrically coupled to the node $Q_N$ of the shift register circuit 800, the control terminal $F_N$ of the switch T5E, the second terminal $O_N$ of the switch T5A, the node $Q_{N+2}$ of the following L-th stage of shift register circuit, ex., L equals to two, respectively, and the enabling signal LC1 or LC2. Both of the circuits are used to pull down the voltage levels of the node $Q_N$ of the shift register circuit 800, the control terminal $F_N$ of the switch T5E, the second terminal $O_N$ of the switch T5A according to the enabling signals LC1 or LC2, the voltage level of the node $Q_N$ of the shift register circuit 800 and the voltage level of the node $Q_{N+2}$ of the following L-th stage of shift register circuit, ex., L equals to two.

In one embodiment of the present invention, the receiving circuit 812 includes a switch T8C. The switch T8C has a first terminal for receiving the scan signal $G_{N-1}$ outputted from the previous M-th stage of shift register circuit, ex., M equals to one, a second terminal electrically coupled to the first terminal of the switch T8B, and a control terminal electrically coupled to the first terminal of the switch T8C. The first pull-down voltage regulator circuit 830 includes switches T8G, T8H, T8I, T8J, T8K, T8L, T8M, T8N and T8O. The switch T8G has a first terminal for receiving the enabling signal LC1, and a control terminal electrically coupled to the first terminal of the switch T8G. The switch T8H has a first terminal electrically coupled to the first terminal of the switch T8G, and a control terminal electrically coupled to the second terminal of the switch T8G. The switch T8I has a first terminal electrically coupled to the second terminal of the switch T8G, a second terminal electrically coupled to the system voltage terminal Vss, and a control terminal electrically coupled to the node $Q_{N+2}$ of the following L-th stage of shift register circuit that is L stages (ex., L equals to two) after the shift register circuit 800. The switch T8J has a first terminal electrically coupled to the second terminal of the switch T8H, a second terminal electrically coupled to the system voltage terminal $V_{ss}$, and a control terminal electrically coupled to the node $Q_{N+2}$ of the following L-th stage of shift register circuit (ex., L equals to two). The switch T8K has first terminal electrically coupled to the second terminal of the switch T8G, a second terminal electrically coupled to the system voltage terminal $V_{ss}$, and a control terminal electrically coupled to the node $Q_N$ of the shift register circuit 800. The switch T8L has a first terminal electrically coupled to the second terminal of the switch T8H, a second terminal electrically coupled to the system voltage terminal $V_{ss}$, and a control terminal electrically coupled to the node $Q_N$ of the shift register circuit 800. The switch T8M has a first terminal electrically coupled to the node $Q_N$ of the shift register circuit 800, a second terminal electrically coupled to the second terminal of the switch T5A, and a control terminal electrically coupled to the second terminal of the switch T8H. The switch T8N has a first terminal electrically coupled to the second terminal of the switch T5A, a second terminal electrically coupled to the system voltage terminal $V_{ss}$, and a control terminal electrically coupled to the second terminal of the switch T8H. The switch T8O has a first terminal electrically coupled to the control terminal $F_N$ of the switch T5E, a second terminal electrically coupled to the system voltage terminal $V_{ss}$, and a control terminal electrically coupled to the second terminal of the switch T8H. The second pull-down voltage regulator circuit 840 includes switches T8P, T8Q, T8R, T8S, T8T, T8U, T8U, T8W and T8X. The switch T8P has a first terminal for receiving the enabling signal LC2, and a control terminal electrically coupled to the first terminal of the switch T8P. The switch T8Q has a first terminal electrically coupled to the first terminal of the switch T8P, and a control terminal electrically coupled to the second terminal of the switch T8P. The switch T8R has a first terminal electrically coupled to the second terminal of the switch T8P, a second terminal electrically coupled to the system voltage terminal $V_{ss}$, and a control terminal electrically coupled to the node $Q_{N+2}$ of the following L-th stage of shift register circuit that is L stages (ex., L equals to two) after the shift register circuit 800. The switch T8S has a first terminal electrically coupled to the second terminal of the switch T8Q, a second terminal electrically coupled to the system voltage terminal $V_{ss}$, and a control terminal electrically coupled to the node $Q_{N+2}$ of the following L-th stage of shift register circuit (ex., L equals to two). The switch T8T has first terminal electrically coupled to the second terminal of the switch T8P, a second terminal electrically coupled to the system voltage terminal Vss, and a control terminal electrically coupled to the node $Q_N$ of the shift register circuit 800. The switch T8U has a first terminal electrically coupled to the second terminal of the switch T8Q, a second terminal electrically coupled to the system voltage terminal $V_{ss}$, and a control terminal electrically coupled to the node $Q_N$ of the shift register circuit 800. The switch T8V has a first terminal electrically coupled to the node $Q_N$ of the shift register circuit 800, a second terminal electrically coupled to the second terminal $O_N$ of the switch T5A, and a control terminal electrically coupled to the second terminal of the switch T8Q. The switch T8W has a first terminal electrically coupled to the second terminal of the switch T5A, a second terminal electrically coupled to the system voltage terminal $V_{ss}$, and a control terminal electrically coupled to the second terminal of the switch T8Q. The switch T8X has a first terminal electrically coupled to the control terminal $F_N$ of the switch T5E, a second terminal electrically coupled to the system voltage terminal $V_{ss}$, and a control terminal electrically coupled to the second terminal of the switch T8Q.

In one embodiment of the present invention, the enabling signals LC1 and LC2 are low frequency signals, and the voltage levels of the enabling signals LC1 and LC2 switch between the high voltage level VGH and low voltage level VGL each period $T_f$. When the enabling signal LC1 is at the high voltage level VGH, the enabling signal LC2 is at the low voltage level VGL; when the enabling signal LC1 is at the low voltage level VGL, the enabling signal LC2 is at the high voltage level VGH. Namely, the first pull-down voltage regulator 830 and the second pull-down voltage regulator 840 can be used to pull down the voltage levels of node $Q_N$ of the shift register circuit 800, the control terminal $F_N$ of the switch T5E and the second terminal $O_N$ of the switch T5A in turns. Consequently, the decrease of the driving power caused by the transistor of the pull-down voltage regulator circuit that is operated under a fixed bias voltage for a long time can be prevented.

Figure 13:
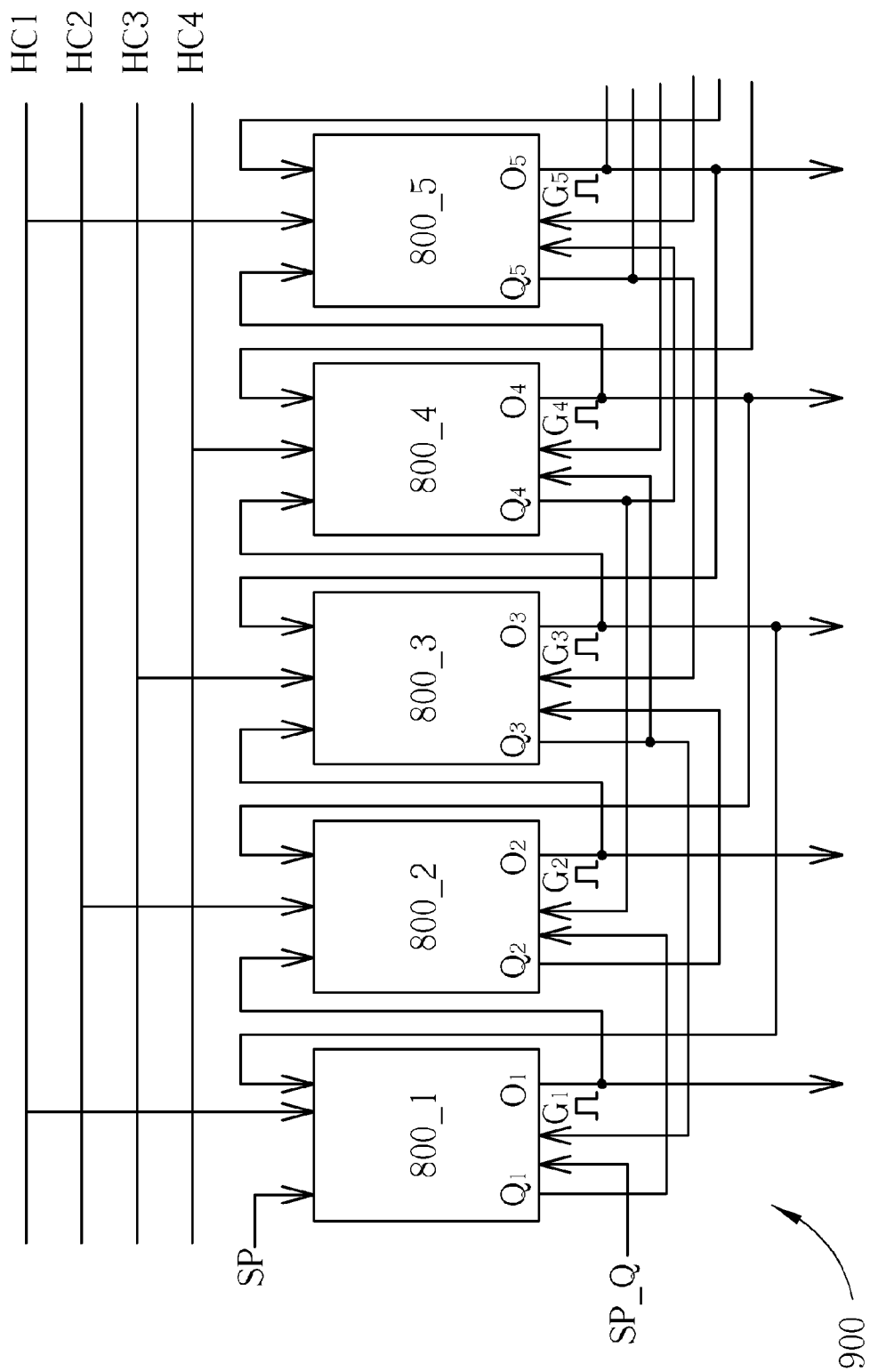
FIG. 13 shows a shift register according to another embodiment of the present invention.

FIG. 13 shows a shift register 900 according to one embodiment of the present invention. The shift register 900 can be used as a gate driver of a display panel. The plurality of stages of the shift register circuit of the shift register 900 can be used to provide a plurality of gate driving signals to turn on and turn off the pixels of the display panel. In FIG. 13, each of the shift register circuits 800_1 to 800_5 can output a gate driving signal $G_1$ to $G_5$ from its output terminal $O_1$ to $O_5$ to the corresponding gate line (also called scan line) in turn for turning on the corresponding row of pixels in the display panel. The shift register circuits 800_2 to 800_5 receive the gate driving signal $G_1$ to $G_4$ from the shift register circuits 800_1 to 800_4 that are M stages (ex., M equals to one) therebefore respectively. The shift register circuit 800_1 receives a first initial signal SP. The shift register circuits 800_2 to 800_5 are electrically coupled to nodes $Q_1$ to $Q_4$ of the prior shift register circuits 800_1 to 800_4, respectively, and the shift register circuit 800_1 receives a second initial signal SP_Q. In addition, the shift register circuits 800_1 to 800_3 are electrically coupled to the nodes $Q_3$ to $Q_5$ and the output terminals $O_3$ to $O_5$ of the shift register circuits 800_3 to 800_5 that are L stages thereafter (ex., L equals to two), respectively. In one embodiment, the shift register circuit 800_1 may output the gate driving signal $G_1$ firstly, and then the register circuits 800_2, 800_3, 800_4 can output the gate driving signal $G_2$, $G_3$, and $G_4$ in turn. The shift register circuit 800_5 is the last shift register circuit to output the driving signal $G_5$ among the five shift register circuits 800_1 to 800_5.

Figure 14:
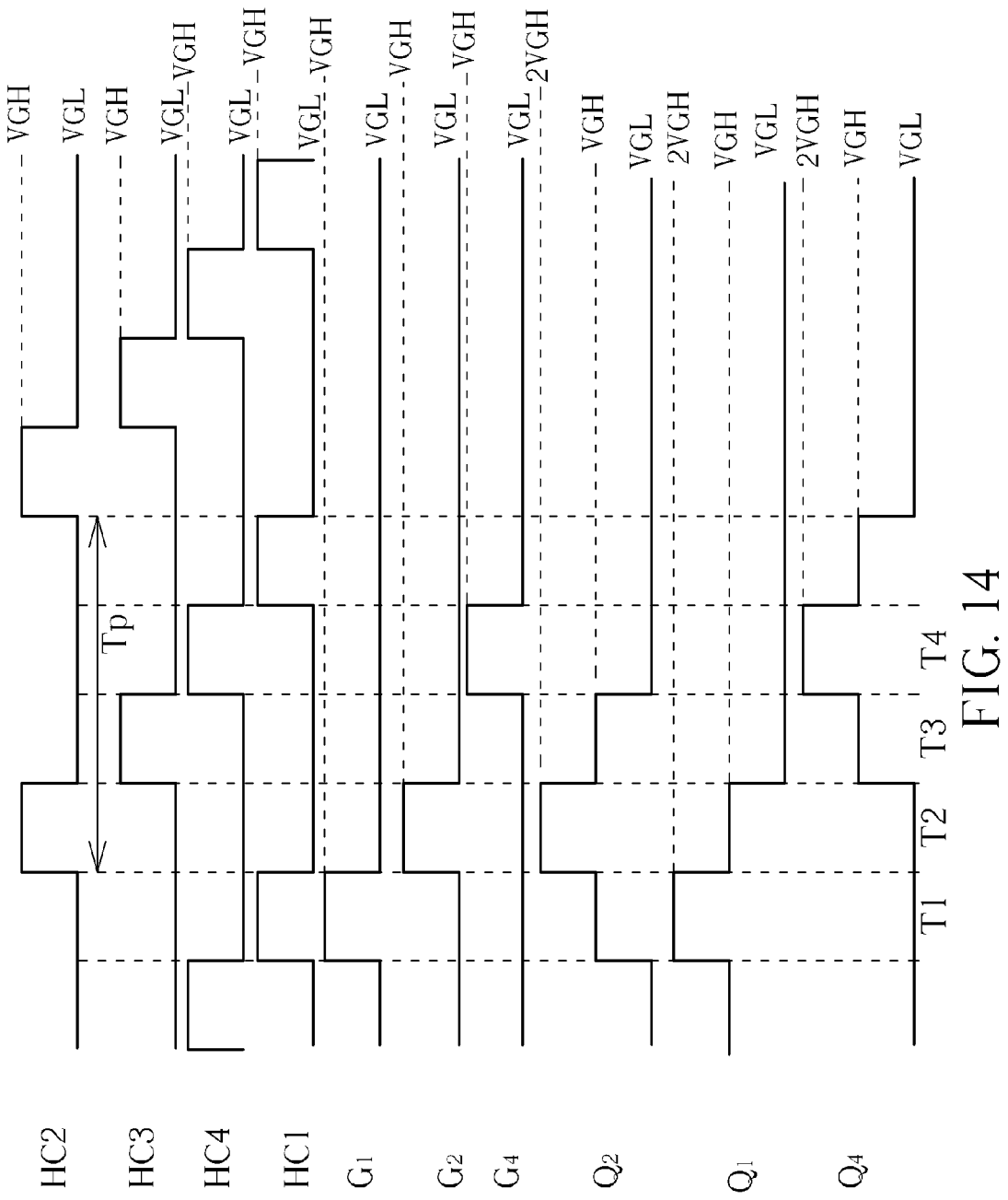
FIG. 14 shows a timing diagram of the shift register in FIG. 13.

Furthermore, the shift register circuits 800_1 to 800_5 receive the clock signals HC1, HC2, HC3, HC4 and HC1 respectively. The voltage levels of the clock signals HC1, HC2, HC3 and HC4 are switching between the high voltage level VGH and the low voltage level VGL. Each of the clock signals HC1, HC2, HC3 and HC4 is provided with the high voltage level VGH once during a period, and the clock signals HC1, HC2, HC3 and HC4 are not provided with the high voltage level VGH at the same time. In FIG. 14, the period of the clock signals HC1, HC2, HC3, and HC4 is $T_p$, and the clock signals HC1, HC2, HC3, and HC4 are changing to the high voltage level VGH at different timing T1, T2, T3, and T4 in the period $T_p$, sequentially. In one embodiment of the present invention, the clock signal HC2 is a quarter of period $T_p$ behind the clock signal HC1, the clock signal HC3 is half of period $T_p$ behind the clock signal HC1, and the clock signal HC4 is three quarters of period $T_p$ behind the clock signal HC1. However, the timing and phases of the present invention are not limited to the aforesaid embodiments.

FIG. 14 shows the timing diagram of the shift register circuit 800_2 of the shift register 900 in FIG. 13. In the embodiment shown in FIG. 14, the enabling signal LC1 is kept at the high voltage level VGH and the enabling signal LC2 is kept at the low voltage level signal VGL. Namely, the shift register circuit 800_2 uses the first pull-down voltage regulator circuit 830 to pull down the voltage levels of the node $Q_2$, the scan signal $G_N$ and the control terminal $F_N$ of the switch T5E. However, as mentioned, the enabling signals LC1 and LC2 can switch between the high voltage level VGH and the low voltage level VGL every period of time $T_f$ so when the enabling signal LC1 is kept at the low voltage level VGL and the enabling signal LC2 is kept at the high voltage level VGH, the shift register circuit 800_2 can use the second pull-down voltage regulator circuit 840 to pull down the voltage levels of the node $Q_2$, the scan signal $G_N$ and the control terminal $F_N$ of the switch T5E. Since the principles of operation are the same, the following explanation will focus on the case that the enabling signal LC1 is at the high voltage level VGH and the enabling signal LC2 is at the low voltage level VGL.

During the duration of T1 in FIG. 14, the clock signal HC2 is at the low voltage level VGL, the scan single $G_1$ is at the high voltage level VGH, the scan signal $G_4$ is at the low voltage level VGL, the node $Q_1$ of the shift register circuit 800_1 is at two times the high voltage level VGH, namely, 2VGH, and the node $Q_4$ of the shift register circuit 800_4 is at the low voltage level VGL. Since the switch T8C is turned on and the voltage level of the node $Q_1$ of the shift register circuit 800_1 is at a higher voltage level, the voltage difference between the control terminal and the second terminal of the switch T8B is larger and can pull up the voltage level of the node $Q_2$ to even closer the high voltage level VGH. The switch T5A is turned on and the voltage level of the scan signal $G_2$ is controlled to be the same low voltage level VGL as the clock signal HC2. The switches T8G, T8K and T8L are turned on. However, since the driving power of the switch T8K is greater than the driving power of the switch T8G, the control terminal of the switch T8H is kept at the low voltage level VGL and the switch T8H is turned off. The second terminal of the switch T8H is also kept at the low voltage level VGL by the turned-on switch T8L, turning off the switches T8M, T8N and T8O. In addition, the switches T5E, T8F, T8I and T8J are all turned off.

During the duration T2, the scan single $G_1$ is changed to the low voltage level VGL, the scan signal $G_4$ is at the low voltage level VGL, the clock signal HC2 is changed to the high voltage level VGH, the node $Q_1$ of the shift register circuit 800_1 is at the high voltage level VGH, and the node $Q_4$ of the shift register circuit 800_4 is still at the low voltage level VGL. The switch T8C is turned off. Since the control terminal and the first terminal of the switch T8B have the same voltage level, the switch T8B is turned off. The switch T5A is still turned on so the scan signal $G_2$ is pulled up to the high voltage level VGH as the clock signal HC2. The voltage level of the node $Q_2$ is pulled up to two times the high voltage level VGH, namely, 2VGH, due to the coupling effect of capacitor C1. The switches T8G, T8K and T8L are still turned on. The switches T8H, T8I, T8J, T8M, T8N and T8O are still turned off. The switch T5F is turned off. In addition, during the period of T2, since the clock signal HC2 is at the high voltage level VGH, the control terminal $F_N$ and the second terminal of the switch T5E are at the same voltage level so the switch T5E is turned off. Also, since the second terminal of the switch T5E is electrically coupled to the output terminal $O_2$, the source-drain voltage gap $V_{ds}$ of the switch T5E is only about one high voltage level VGH. In addition, since the switches T8B and T8C are turned off, the first terminal of the switch T8B will kept at the high voltage level VGH firstly so the source-drain voltage gap $V_{ds}$ of the switch T8B is also about one high voltage level VGH. Therefore, the current leakage on the node $Q_N$ due to the large source-drain voltage gap $V_{ds}$ as shown in the prior art can be reduced and the issue of driving power weakening due to the current leakage can also be improved. In addition, since the control terminal $F_N$ of the switch T5E is at the same voltage level as the second terminal of the T5E and the control terminal of the switch T8B is at the same voltage level as the first terminal of the switch T8B, the current leakage caused by the over backward bias voltage of the gate-source voltage $V_{gs}$ can also be reduced.

During the duration of T3, the scan single $G_1$ and $G_4$ are at the low voltage level VGL, the clock signal HC2 is changed to the low voltage level VGL, the node $Q_1$ of the shift register circuit 800_1 is at the low voltage level VGL, and the node $Q_4$ of the shift register circuit 800_4 is changed to the high voltage level VGH. The switch T8B is turned off. The switch T5A is still turned on, which pulls down the voltage levels of the scan signal $G_2$ to the same low voltage level VGL as the clock signal HC2. The switch T8G, T8I, T8J, T8K and T8L are turned on and the switches T8H, T8M, T8N and T8O are all turned off. The switches T5E and T5F are turned off.

During the duration of T4, the scan single $G_1$ is still at the low voltage level VGL, the scan signal $G_4$ is changed to the high voltage level VGH, the clock signal HC2 is still at the low voltage level VGL, the node $Q_1$ of the shift register circuit 800_1 is still at the low voltage level VGL, and the node $Q_4$ of the shift register circuit 800_4 is changed to two times the high voltage level 2VGH. The switches T8C and T8B are turned off and the switches T5E and T5F are turned on so that the voltage level of the node $Q_2$ is pulled down to the low voltage level VGL. Thus, the switches T5A, T8K and T8L are turned off and the switch T8G is still turned on. However, since the switches T8I and T8J are still turned on, the second terminals of the switches T8G and T8H are both pulled down to the low voltage level VGL so that the switches T8H, T8M, T8N and T8O are all turned off. Therefore, the control terminal $F_N$ of the switch T5E will not be pulled down so the switch T5E can be turned on and keep the voltage level of the node $Q_2$ at the low voltage level stably.

According to the aforesaid embodiment, the pull-down controlling circuit 522 of the shift register circuit 800_2 can pull up the voltage level of the control terminal $F_N$ of the switch T5E to the same voltage level as the second terminal of the switch T5E and turn off the switch T5E when the scan signal $G_2$ outputted from the shift register circuit 800_2 is at the high voltage level VGH. Also, since the second terminal of the switch T5E of the shift register circuit 800_2 is electrically coupled to the output terminal $O_2$, the source-drain voltage gap $V_{ds}$ of the switch T5E can be reduced so that the current leakage on the node $Q_2$ of the shift register circuit 800_2 can also be reduced. Also, the receiving circuit 812 and the switch T8B of the shift register circuit 800_2 can reduce the voltage difference between the first terminal of the switch T8B and the node $Q_2$ of the shift register circuit 800_2 and make the voltage level of the control terminal of the switch T8B equal to the voltage level of the first terminal of the switch T8B according to the voltage level of the node $Q_1$ of the shift register circuit 800_1 that is M stages before (ex., M equals to one) the shift register circuit 800_2 and the scan signal $G_1$ outputted from the shift register circuit 800_1 that is M stages before (ex., M equals to one) the shift register circuit 800_2 so that the current leakage on the node $Q_2$ of the shift register circuit 800_2 can be reduced. Consequently the correctness of the waveform of the gate driving signal outputted by the shift register 900 can be ensured, and the wrong charging of the display panel can be prevented.

Figure 15:
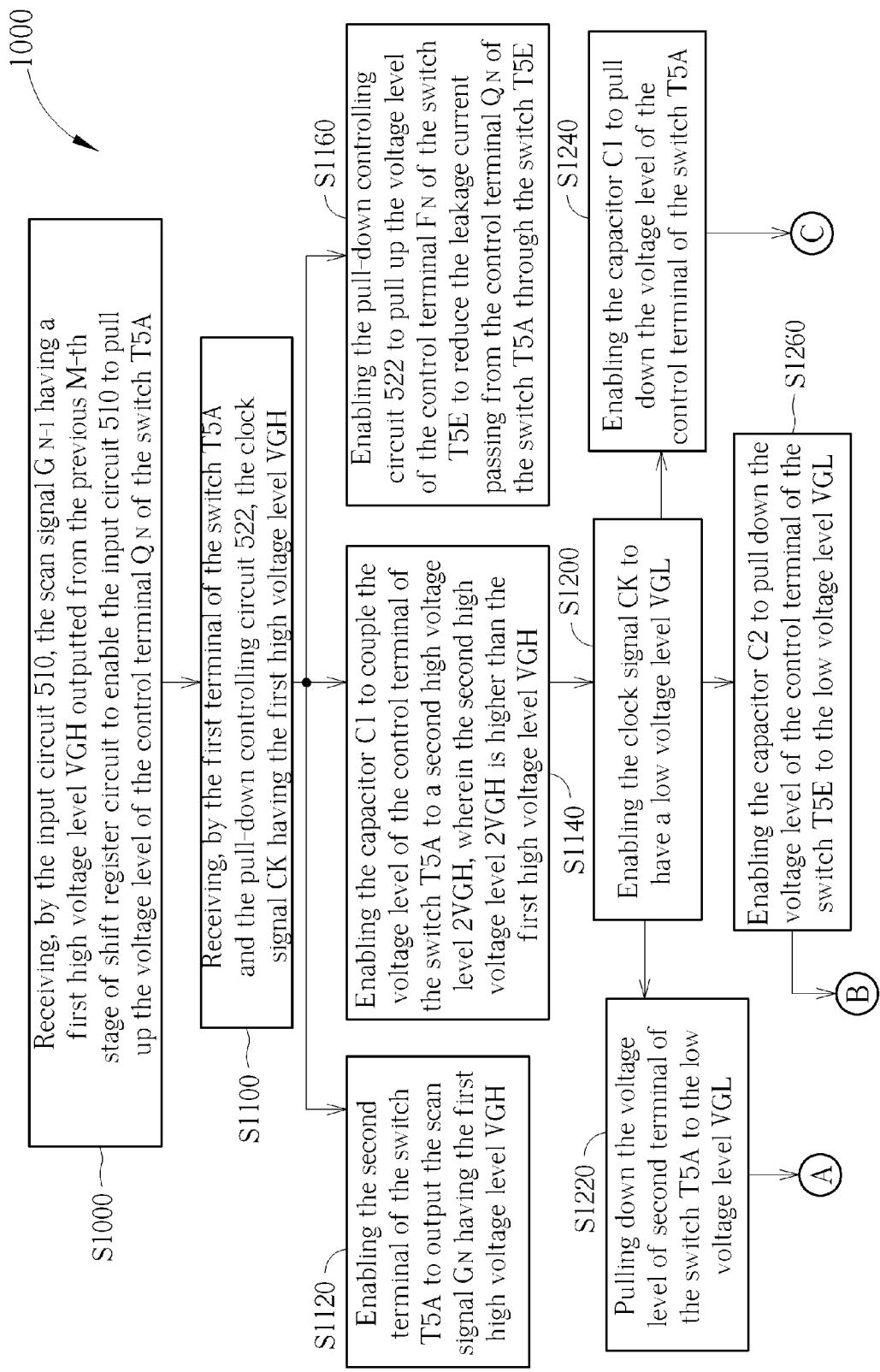
FIG. 15 shows a flow chart of a method of driving a shift register according to one embodiment of the present invention.

FIG. 15 shows a flow chart of a method 1000 for driving the shift register 600 according to one embodiment of the present invention. The shift register 600 includes a plurality of stages of shift register circuit 500_1 to 500_5 and each of the shift register circuit 500_1 to 500_5 has the same structure as the shift register circuit 500 in FIG. 7. The method 1000 of driving the shift register 600 includes providing the shift register 600 and the following steps:

S1000: receiving, by the input circuit 510, the scan signal $G_{N-1}$ having a first high voltage level VGH outputted from the previous M-th stage of shift register circuit to enable the input circuit 510 to pull up the voltage level of the control terminal $Q_N$ of the switch T5A;

S1100: receiving, by the first terminal of the switch T5A and the pull-down controlling circuit 522, the clock signal CK having the first high voltage level VGH;

S1120: enabling the second terminal of the switch T5A to output the scan signal $G_N$ having the first high voltage level VGH;

S1140: enabling the capacitor C1 to couple the voltage level of the control terminal of the switch T5A to a second high voltage level 2VGH, wherein the second high voltage level 2VGH is higher than the first high voltage level VGH;

S1160: enabling the pull-down controlling circuit 522 to pull up the voltage level of the control terminal $F_N$ of the switch T5E to reduce the leakage current passing from the control terminal $Q_N$ of the switch T5A through the switch T5E;

S1200: enabling the clock signal CK to have a low voltage level VGL;

S1220: pulling down the voltage level of second terminal of the switch T5A to the low voltage level VGL;

S1240: enabling the capacitor C1 to pull down the voltage level of the control terminal of the switch T5A;

S1260: enabling the capacitor C2 to pull down the voltage level of the control terminal of the switch T5E to the low voltage level VGL.

Figure 16:
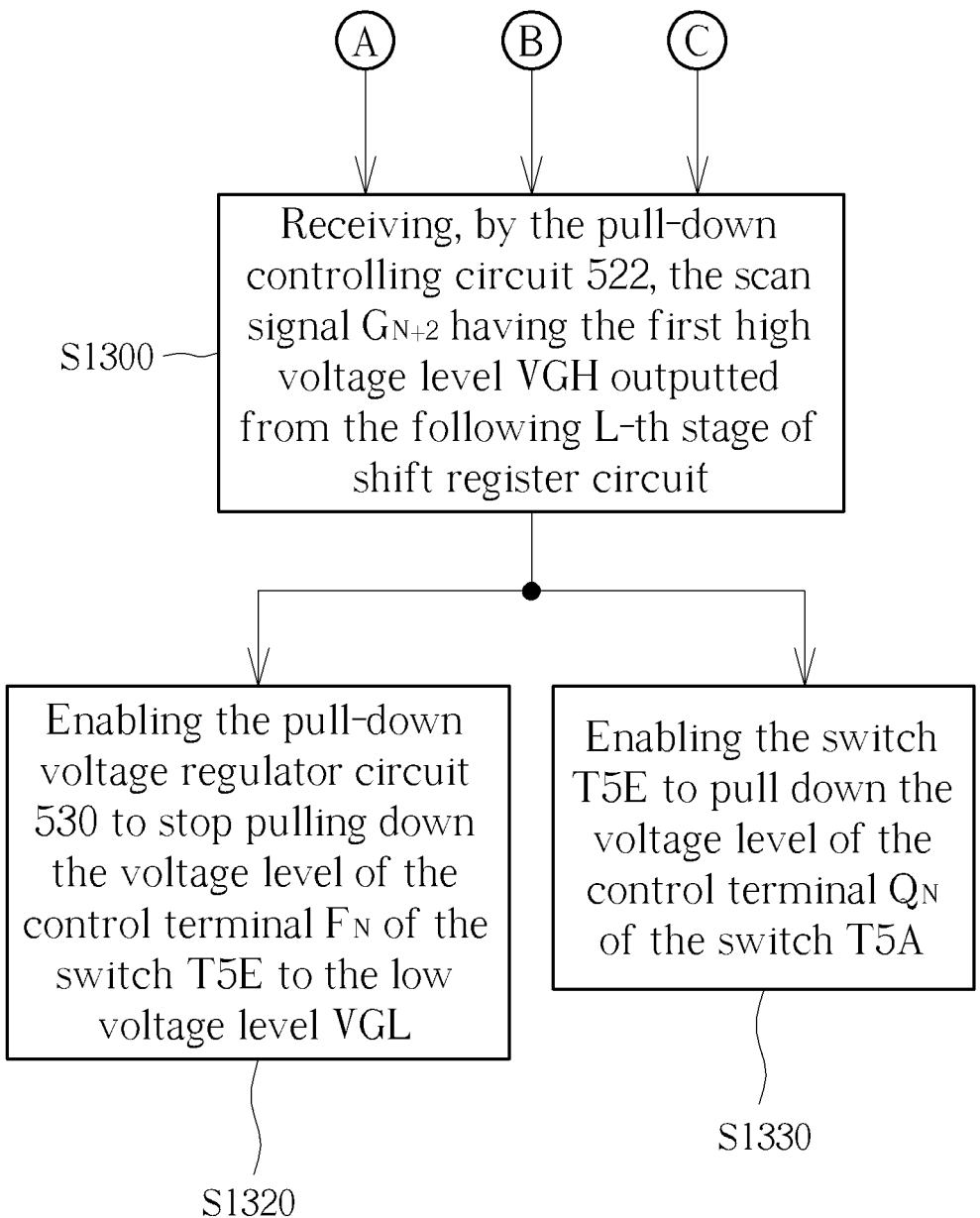
FIG. 16 shows a flow chart of a method of driving a shift register according to another embodiment of the present invention.

In addition, to pull down the voltage level of the control terminal $Q_N$ of the switch T5A to the low voltage level VGL properly, the method 1000 for driving the shift register 600 can further includes the following steps after steps S1220, S1240 and S1260 (marked as A, B and C in FIG. 15) as shown in FIG. 16:

S1300: receiving, by the pull-down controlling circuit 522, the scan signal $G_{N+2}$ having the first high voltage level VGH outputted from the following L-th stage of shift register circuit, ex., L equals to two;

S1320: enabling the pull-down voltage regulator circuit 530 to stop pulling down the voltage level of the control terminal $F_N$ of the switch T5E to the low voltage level VGL;

S1330: enabling the switch T5E to pull down the voltage level of the control terminal $Q_N$ of the switch T5A.

According to the aforesaid embodiment, the method 1000 for driving the shift register 600 can reduce the source-drain voltage gap $V_{ds}$ of the switch T5E so that the current leakage on the node $Q_2$ of the shift register circuit 500 can also be reduced. Consequently the correctness of the waveform of the gate driving signal outputted by the shift register 600 can be ensured, and the wrong charging of the display panel can be prevented.

In summary, according to the embodiments of the present invention, the shift registers and the methods of operating the shift register can reduce the source-drain voltage gap $V_{ds}$ of the transistors in the shift register circuit and make the voltage level of the gate of the transistors equal to the voltage of the source of the transistors so that the current leakage on the internal node of the shift register circuit can be reduced and the correctness of the waveform of the gate driving signal outputted by the shift register can be ensured, which can prevent the display panel from wrong charging.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shift register comprising a plurality of stages of shift register circuit, wherein each stage of shift register circuit comprises:
   a first switch having a first terminal for receiving a clock signal, a second terminal for outputting a first scan signal of current stage of shift register circuit, and a control terminal electrically coupled to a node of the current stage of shift register circuit;
   an input circuit comprising:
      a second switch having a first terminal, a second terminal electrically coupled to the node of the current stage of shift register circuit, and a control terminal electrically coupled to a node of a previous M-th stage of shift register circuit in the plurality of stages of shift register circuit, wherein M is a positive integer; and
      a receiving circuit electrically coupled to the first terminal of the second switch, for receiving a scan signal outputted from the previous M-th stage of shift register circuit, and for controlling a voltage level of the first terminal of the second switch according to the scan signal;
   a pull-down circuit electrically coupled to the node of the current stage of shift register circuit and for pulling down a voltage level of the node of the current stage of shift register circuit according to a scan signal outputted from a following L-th stage of shift register circuit in the plurality of stages of shift register circuit, wherein L is a positive integer; and
   a pull-down voltage regulator circuit electrically coupled to the node of the current stage of shift register circuit and the second terminal of the first switch and for pulling down a voltage level of the second terminal of the first switch according to the voltage level of the node of the current stage of shift register circuit.

2. The shift register of claim 1, wherein each stage of shift register circuit further comprises:
   a third switch having a first terminal for receiving the clock signal, a second terminal for outputting a second scan signal, and a control terminal electrically coupled to the node of the current stage of shift register circuit;
   wherein the receiving circuit for receiving the scan signal outputted from the previous M-th stage of shift register circuit is to receive a first scan signal outputted from the previous M-th stage of shift register circuit or a second scan signal outputted from the previous M-th stage of shift register circuit, and the pull-down circuit for pulling down the voltage level of the node of the current stage of shift register circuit according to the scan signal outputted from the following L-th stage of shift register circuit is to receive a first scan signal outputted from the following L-th stage of shift register circuit or a second scan signal outputted from the following L-th stage of shift register circuit.

3. The shift register of claim 1, wherein the pull down circuit of each stage of shift register circuit comprises:
   a fourth switch having a first terminal electrically coupled to the node of the current stage of shift register circuit, a second terminal electrically coupled to the second terminal of the first switch, and a control terminal;
   a capacitor having a first terminal for receiving the clock signal and a second terminal electrically coupled to the control terminal of the fourth switch; and
   a fifth switch having a first terminal for receiving the scan signal outputted from the following L-th stage of shift register circuit, a second terminal electrically coupled to the second terminal of the capacitor, and a control terminal electrically coupled to the first terminal of the fifth switch.

4. A shift register comprising a plurality of stages of shift register circuit, wherein each stage of shift register circuit comprises:
   an input circuit for receiving a scan signal outputted from a previous M-th stage of shift register circuit and for pulling up a voltage level of a node of current stage of shift register circuit according to the scan signal;
   a first switch having a first terminal for receiving a clock signal, a second terminal for outputting a first scan signal of the current stage of shift register circuit, and a control terminal electrically coupled to the node of the current stage of shift register circuit;
   a pull-down circuit comprising:
      a second switch having a first terminal electrically coupled to the node of the current stage of shift register circuit, a second terminal electrically coupled to the second terminal of the first switch, and a control terminal;
      a pull-down controlling circuit for receiving the clock signal and a scan signal outputted from a following L-th stage of shift register circuit and for controlling a voltage level of the control terminal of the second switch according to the clock signal and the scan signal outputted from the following L-th stage of shift register circuit, wherein L is a positive integer; and
   a first pull-down voltage regulator circuit electrically coupled to the node of the current stage of shift register circuit, the second terminal of the first switch and a node of the following L-th stage of shift register circuit, and for pulling down a voltage level of the second terminal of the first switch according to the voltage level of the node of the current stage of shift register circuit and a voltage level of the node of the following L-th stage of shift register circuit.

5. The shift register of claim 4, wherein each stage of shift register circuit further comprises:
   a third switch having a first terminal for receiving the clock signal, a second terminal for outputting a second scan signal, and a control terminal electrically coupled to the node of the current stage of shift register circuit;
   wherein the input circuit for receiving the scan signal outputted from the previous M-th stage of shift register circuit is to receive a first scan signal outputted from the previous M-th stage of shift register circuit or a second scan signal outputted from the previous M-th stage of shift register circuit, and the pull-down controlling circuit for receiving the scan signal outputted from the following L-th stage of shift register circuit is to receive a first scan signal outputted from the following L-th stage of shift register circuit or a second scan signal outputted from the following L-th stage of shift register circuit.

6. The shift register of claim 4, wherein the input circuit comprises:
   a fourth switch having a first terminal, a second terminal electrically coupled to the node of the current stage of shift register circuit, and a control terminal electrically coupled to a node of the previous M-th stage of shift register circuit; and
   a receiving circuit for receiving the scan signal outputted from the previous M-th stage of shift register circuit, and for reducing a voltage level difference between the first terminal of the fourth switch and the node of the current stage of shift register circuit and for making a voltage level of the control terminal of the fourth switch equal to a voltage level of the first terminal of the fourth switch when the first scan signal is of the high voltage level.

7. The shift register of claim 4, wherein the pull-down controlling circuit comprises:
   a capacitor having a first terminal for receiving the clock signal and a second terminal electrically coupled to the control terminal of the second switch; and
   a fifth switch having a first terminal for receiving the scan signal outputted from the following L-th stage of shift register circuit, a second terminal electrically coupled to the second terminal of the capacitor, and a control terminal electrically coupled to the first terminal of the fifth switch.

8. The shift register of claim 4, further comprising:
   a second pull-down voltage regulator circuit electrically coupled to the node of the current stage of shift register circuit, the second terminal of the first switch, a second enabling signal and the node of the following L-th stage of shift register circuit, and for pulling down the voltage level of the node of the current stage of the shift register circuit and the voltage level of the second terminal of the first switch according to a voltage level of the second enabling signal, the voltage level of the node of the current stage of shift register circuit and the voltage level of the node of the following L-th stage of shift register circuit;
   wherein the first pull-down voltage regulator circuit further receives a first enabling signal and for pulling down the voltage level of the node of the current stage of shift register circuit and the voltage level of the second terminal of the first switch according to the first enabling signal, and the first enabling signal and the second enabling signal are complementary to each other.

9. The shift register of claim 4, wherein the first pull-down voltage regulator circuit comprises:
   a sixth switch having a first terminal for receiving a first enabling signal, a second terminal, and a control terminal electrically coupled to the first terminal of the sixth switch;
   a seventh switch having a first terminal for receiving the first enabling signal, a second terminal, and a control terminal electrically coupled to the second terminal of the sixth switch;
   an eighth switch having a first terminal electrically coupled to the second terminal of the sixth switch, a second terminal electrically coupled to a system voltage terminal, and a control terminal electrically coupled to the node of the following L-th stage of shift register circuit;
   a ninth switch having a first terminal electrically coupled to the second terminal of the seventh switch, a second terminal electrically coupled to the system voltage terminal, and a control terminal electrically coupled to the node of following L-th stage of the shift register circuit;
   a tenth switch having a first terminal electrically coupled to the control terminal of the second switch, a second terminal electrically coupled to the system voltage terminal, and a control terminal electrically coupled to the second terminal of the seventh switch;
   wherein the eighth switch and the ninth switch pull down a voltage level of the second terminal of the seventh switch to prevent the tenth switch from pulling down the voltage level of the control terminal of the second switch when the scan signal of the following L-th stage of shift register circuit is of the high voltage level.

10. A method of driving a shift register, the method comprising:
providing the shift register comprising a plurality of stages of shift register circuit, each stage of shift register circuit comprising an input circuit, a first switch, a capacitor, a pull-down circuit and a pull-down voltage regulator circuit, the first switch having a control terminal electrically coupled to the input circuit, a first terminal, and a second terminal, the capacitor having a first terminal electrically coupled to the control terminal of the first switch, a second terminal electrically coupled the second terminal of the first switch, the pull-down circuit comprising a pull-down controlling circuit and a second switch, the second switch having a first terminal electrically coupled to the control terminal of the first switch, a second terminal electrically coupled to the second terminal of the first switch, and a control terminal electrically coupled to the pull-down controlling circuit, the pull-down voltage regulator circuit electrically coupled to the second terminal and the control terminal of the first switch;
receiving, by the input circuit, a scan signal having a first high voltage level outputted from a previous M-th stage of shift register circuit to enable the input circuit to pull up a voltage level of the control terminal of the first switch, wherein M is a positive integer;
receiving, by the first terminal of the first switch and the pull-down controlling circuit, a clock signal having the first high voltage level to enable:
the second terminal of the first switch to output a scan signal having the first high voltage level;
the capacitor to couple the voltage level of the control terminal of the first switch to a second high voltage level, wherein the second high voltage level is higher than the first high voltage level; and
the pull-down controlling circuit to pull up a voltage level of the control terminal of the second switch; and
enabling the clock signal to have a low voltage level to enable:
the second terminal of the first switch to be pulled down to the low voltage level; and
the capacitor to pull down the voltage level of the control terminal of the first switch.

11. The method of claim 10, wherein the pull-down voltage regulator circuit of each stage of shift register circuit is further electrically coupled to the control terminal of the second switch and a control terminal of a first switch of a following L-th stage of shift register circuit, L is a positive integer, the method further comprising:
receiving, by the pull-down controlling circuit, a scan signal having the first high voltage level outputted from the following L-th stage of shift register circuit to enable the pull-down voltage regulator circuit to stop pulling down the voltage level of the control terminal of the second switch to the low voltage level and to enable the second switch to pull down the voltage level of the control terminal of the first switch of the current stage of shift register circuit.

* * * * *